United States Patent
Kliza et al.

[19]

[11] Patent Number: 5,852,640

[45] Date of Patent: Dec. 22, 1998

[54] CLOCK DISTRIBUTION APPARATUS WITH CURRENT SENSED SKEW CANCELLING

[76] Inventors: Phillip S. Kliza, 124 Amaya Dr., Folsom, Calif. 95630; William P. Cornelius, 114 Escobar Ct., Los Gatos, Calif. 95032

[21] Appl. No.: 494,367

[22] Filed: Jun. 26, 1995

[51] Int. Cl.⁶ .................. H04L 7/02; H03D 3/24
[52] U.S. Cl. .................. 375/356; 375/376; 371/1; 327/158
[58] Field of Search .................. 375/356, 376, 375/373, 371, 357, 358; 371/1; 327/144, 146, 147, 149, 150, 153, 155, 156, 158, 159, 161, 162, 163; 326/93, 96

[56] References Cited

U.S. PATENT DOCUMENTS

| | | | |
|---|---|---|---|
| 4,833,695 | 5/1989 | Greub | 375/371 |
| 4,998,262 | 3/1991 | Wiggers | 375/107 |
| 5,258,660 | 11/1993 | Nelson et al. | 307/269 |
| 5,298,866 | 3/1994 | Kaplinsky | 328/155 |
| 5,361,277 | 11/1994 | Grover | 375/356 |
| 5,398,262 | 3/1995 | Ahuja | 375/356 |
| 5,422,915 | 6/1995 | Byers | 375/357 |
| 5,491,442 | 2/1996 | Mirov et al. | 327/295 |

OTHER PUBLICATIONS

Hill and Peterson, "Introduction to Switching Theory and Logic Design", Third Edition, John Wiley and Sons, Inc., pp. 249–266, 1981.

*Primary Examiner*—Chi H. Pham
*Assistant Examiner*—William Luther
*Attorney, Agent, or Firm*—Thomas Schneck; Rosalio Haro

[57] ABSTRACT

A clock distribution apparatus with active phase alignment which makes the incidence of a timing event occur essentially simultaneously at multiple physically remote destinations. The circuit uses traces configured as reflective transmission lines with a matched impedance input. The propagation time of a transmission line is determined by monitoring the current into the transmission line. Variable delays are determined for each transmission line by measuring the actual propagation time and reducing a predetermined maximum delay time by that amount. The variable delay values are stored and used to retard clock edges by the varying amounts so that all clock edges arrive at respective remote destinations at a time equal to the maximum delay time.

23 Claims, 16 Drawing Sheets

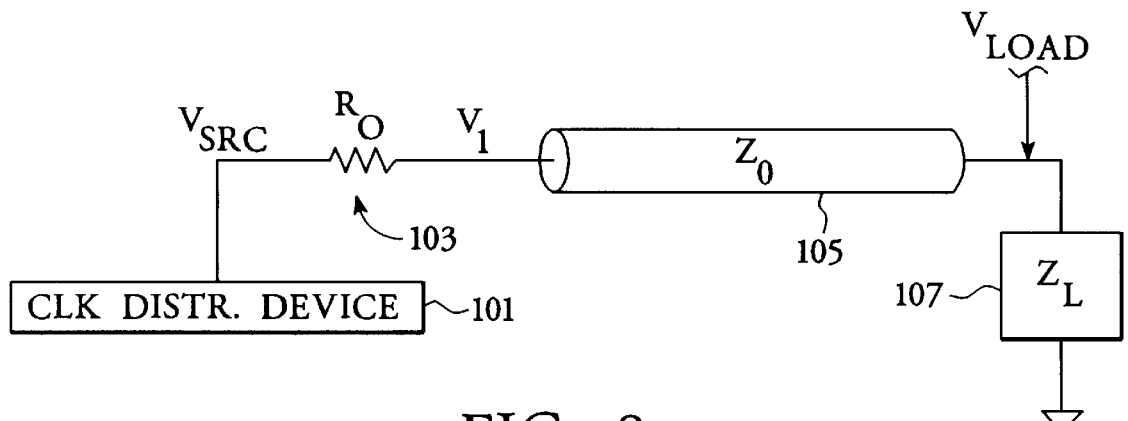
FIG. 8
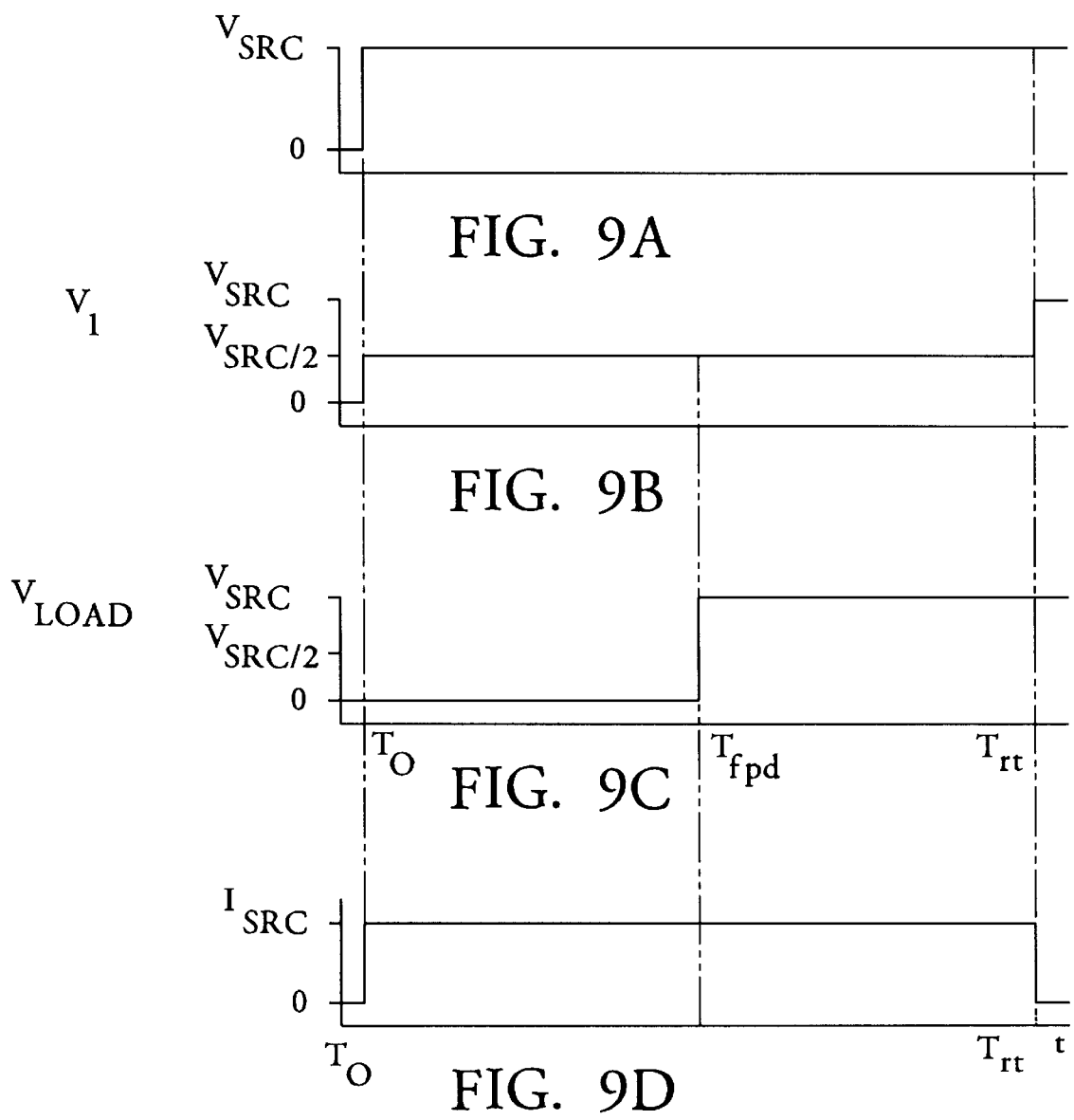
FIG. 9A
FIG. 9B
FIG. 9C
FIG. 9D

CLOCK DISTRIBUTION APPARATUS WITH CURRENT SENSED SKEW CANCELLING

TECHNICAL FIELD

The invention relates to distribution of clock signals in digital circuits, and in particular to providing clock edges which define simultaneous timing events at destination digital subsystems.

BACKGROUND ART

There is a need for a clock source to provide simultaneous timing signals to a digital system. The timing signals are a series of timing events occurring at discrete and equal time intervals typically defined by a physical change in a voltage or current parameter. This physical change is frequently termed a "clock edge" and is usually associated with a rising and/or falling shift in the voltage or current level of a timing signal. The interval from the initiation of a first timing event to a second timing event is termed a "cycle", and a signal comprising a series of timing event cycles is called a clock. The timing event typically originates from a single oscillator source and is distributed through a clock distribution apparatus to one or more subsystem components. The respective subsystem components then distribute the timing event to their constituent parts. The use of a clock in a digital system or more specifically a sequential digital system is well known and is described for example by Hill and Peterson, "Introduction to Switching Theory and Logic Design", Third Edition, John Wiley and Sons, Inc., 1981, pp. 249–266, which is hereby incorporated by reference. Examples of binary logic circuits are discussed in Ibid. pp. 64–95.

The industry trend has been to minimize the time interval between successive timing events. This provides for a system that executes more tasks per unit time. Such a system is said to have a higher clock speed. A discussion of elements that limit the minimum time interval between successive timing events is given in Ibid. pp. 253–261. A digital system generally consists of multiple subsystem components, each containing sequential logic circuitry. These subsystem components exchange logic signals and are constituents of a larger digital system. As such, they require timing events from the same clock source. The timing events, clock edges, are signals that propagate at finite speed resulting in a time delay from the instant a timing event is initiated at a clock source to the instant it arrives at a subsystem component. Subsystem components cannot be located at the same physical point leading to the possibility that not all subsystem components will receive a timing event at the same time.

Generally, a subsystem component coordinates the initiation of a series of digital operations with the arrival of a timing event. If a clock system is such that timing events do not arrive at each subsystem component at the same time, then the difference in time between the arrival of timing events at different subsystem components is termed clock skew. Clock skew can prevent the various subsystem components from properly coordinating their operations with each other. To avoid possible logic errors resulting from clock skew between subsystem components, the time interval between consecutive timing events is increased to allow for the difference in propagation times between a clock source and the various subsystem components. Thus a system with negligible clock skew can operate at a higher clock speed than an otherwise identical system with clock skew.

With reference to FIG. 1, the path taken by a clock source 11 to a first subsystem component 10 is much shorter than the path taken to a second subsystem component 12. As a result, the first subsystem component 10 will receive a timing event before the second subsystem component 12 by a time $T_{skew}$. If the second subsystem component 12 responds to a first timing event by processing data and then sending the result to the first subsystem component 10 on logic lines 13 and the first subsystem component responds to a second timing event by latching in the information on logic lines 13 and processing it, clock skew would affect the performance of the entire system in the following manner. The time interval between consecutive timing events, $T_{cycle}$, must be long enough to allow for data processing delay $T_{PD1}$ at the first subsystem component 10 and data processing delay $T_{PD2}$ at the second subsystem component 12, allow time for the propagation of data $T_p$ on logic lines 13, and allow time for a clock edge to propagate from the first subsystem component 10 to the second subsystem component 12, $T_{skew}$. In this case the minimum cycle time, $T_{cycle}$, is given by:

$$T_{cycle} > T_{PD1} + T_{PD2} + T_p + T_{skew}. \qquad \text{Eq. (1)}$$

It is evident that the minimum cycle time is larger in a system with clock skew, $T_{skew} > 0$, than in a system without clock skew, $T_{skew} = 0$, by an amount equal to the clock skew. Therefore, to maximize the speed of a system, all of the subsystem components should receive the timing event, clock edge, simultaneously.

Historically, clock skew had not been an issue because the clock propagation time between subsystem components was a small fraction of the time interval between timing events. At present, however, logic systems with clock speeds exceeding 50 MHz are being used and the trend is for the clock speed to increase in future designs. In systems exceeding 50 MHz, the interval between timing events is less than 20 nanoseconds. In such systems, the time for a subsystem component to complete its task and communicate with another subsystem component is compromised significantly if the clock skew is 1 nsec or more. For example, the propagation speed of a clock signal on a typical printed circuit board using copper traces to route signals is approximately 6 inches per nanosecond. The size of a circuit board in a personal computer is commonly 9 inches by 9 inches, and the clock signals are routed via copper traces that are typically less than 12 inches long. On a 12 inch trace, a delay of 2 nsec will exist from the instant a timing event is initiated at a clock source to the time it arrives at the end of the trace. This 2 nsec delay is 10% of the allotted time interval between timing events in a 50 MHz system.

FIG. 2 illustrates the clock signal routing employed when a clock source 15 with a single output is used to distribute a clock signal to multiple digital subsystems 16–18. The clock source 15 routes a clock edge signal to the destination digital subsystems 16–18 in a serial fashion, first to the first digital subsystem 16, then to the second digital subsystem 17, and finally to the third digital subsystem 18. This results in a large clock skew between the first digital subsystem 16 and the third digital subsystem 18.

FIG. 3 illustrates a first approach that is commonly used to minimize system clock skew. Clock distribution apparatus 20 creates multiple copies of a single clock, and routes separate copies of the clock to digital subsystems 21–24. The time variations in the occurrence of the timing event at the different subsystem modules is reduced with respect to FIG. 2.

A second approach, shown in FIG. 4, to improve the system speed is to add custom routing of multiple copies of a clock from a clock distribution apparatus 25 to each digital subsystem such that each trace 31–34 has an equal length from the clock distribution apparatus 25 to each digital subsystem 26–29 respectively. Equal trace lengths imply equal clock propagation delays and therefore no clock skew. This scheme allows the desired objective of having the timing events occur simultaneously at each subsystem. The disadvantage is that the clock traces must be custom routed, and sometimes this is physically difficult or impractical.

U.S. Pat. No. 4,998,262 describes a third approach to solving the clock distribution issue. The approach uses a simple single clock source with a dual daisy chain distribution scheme coupled with a receiver circuit at each digital subsystem that can regenerate or synthesize the required clock from the information available in the signal on the dual daisy chain. The inherent disadvantage of the scheme is that it requires a receiver circuit with each subsystem. Further, the receiver circuit includes such elements as a phase-locked loop, which is a large and complex circuit.

The first three approaches of reducing clock skew previously described cannot accommodate variations in propagation delay as a result of manufacturing variations between individual production units of a digital system nor can they accommodate the propagation delay of expansion modules. In the case of a signal routed to expansion modules it is not possible for the designer to know apriori what expansion devices will be used or created in the future and by extension the associated delay within the expansion modules is not known.

A fourth approach toward achieving simultaneous arrival of a timing event at multiple digital subsystems, illustrated in FIG. 5, is to have a clock distribution apparatus 30 which sends copies of a single clock source 35 through programmable delay elements, 36–39, to digital subsystems 41–44. Each programmable delay element, 36–39, may be individually programmed to introduce a specific amount of delay to each copy of the clock source 35 before the clock signal is sent to a corresponding digital subsystem 41–44. In this manner, the simultaneous arrival of a timing event at each digital subsystem 41–44 can be assured. The appropriate delay required for each programmable delay element, 36–39, is established during the design phase of the product or is measured after fabrication of the product. The necessary delay is then programmed into each programmable delay element 36–39. U.S. Pat. No. 5,258,660 to Nelson is an example of a clock distribution system using programmable delay elements to compensate for clock skew.

A fifth approach used to achieve simultaneous arrival of the timing events at different digital subsystems, illustrated in FIG. 6, is similar to the fourth approach with the additional feature of feedback signals 46–49 used to regulate self adjustable delay elements 51–54 of a clock distribution apparatus 43. Thus, the fifth approach can self-adjust a delay element to compensate for changes on a printed circuit board. This is the subject of U.S. Pat. No. 5,298,866. Each feedback signal is a trace that is routed from a digital subsystem 61–64 back to the clock distribution apparatus 43.

In FIG. 6, the clock distribution apparatus 43 has an input that receives a clock edge from clock source 45 and receives feedback signals along paths 46–49. A clock edge propagates through self adjustable delay elements 51–54 to respective digital subsystems 61–64 on feed forward traces 66–69 and back to the clock distribution apparatus 43 on feedback traces 46–49. Each feed forward trace and each feedback trace are connected at their corresponding destination digital subsystem 61–64. Each feedback signal 46–49 arrives at the clock distribution apparatus 43 after propagating from self adjustable delay elements 51–54 to a corresponding destination digital subsystem 61–64 and back to the clock distribution apparatus 43. By noting when a clock edge is launched on a feed forward trace 66–69 and when the same clock edge returns on the corresponding feedback trace 46–49, each self adjustable delay element 51–54 can estimate the round trip time, $T_{round\_trip}$, of a clock edge. That is, the amount of time it takes a clock edge to travel from the clock distribution apparatus 43 to each digital subsystem 61–64 and loop back to the clock distribution device 43. With knowledge of $T_{round\_trip}$, each self adjustable delay element 51–54 can self-adjust itself to provide an appropriate delay such that all clock edges arrive at their corresponding digital subsystems 61–64 at essentially the same time.

Some of the limitations associated with this method of reducing clock skew are as follows. First, two separate pins are needed per clock output, one for the feed forward trace 66–69 and another for the feedback trace 46–49. This results in a clock distribution apparatus 43 of larger dimensions requiring more area on a printed circuit board. Plus, in order to reduce the error between the feed forward propagation time and the feedback propagation time, the two traces must be placed closely together on the printed circuit board complicating the layout design of the printed circuit board.

A sixth approach illustrated in FIG. 7 builds on the fifth method described above. Like the fifth method, the clock distribution apparatus 75 monitors the round trip propagation time of a clock edge to destination digital subsystems 76–79 and tunes self adjustable delay elements 85–88 to shift in time or phase the occurrence of a clock edge. However, unlike the fifth method which requires a feed forward trace to a destination digital subsystem to send a clock edge and a feedback trace to receive the same clock edge back from the destination digital subsystem, the method of FIG. 7 utilizes only one trace per clock edge.

The clock distribution apparatus 75 relies on the reflective properties of a transmission line to calculate the round trip propagation time of a clock edge. An external terminating resistance 96–99 is placed in series between the output of each self adjustable delay element 85–88 and a corresponding feed forward trace 71–74. The side of each resistance 96–99 connected to a forward trace 71–74 is also coupled to an input of a corresponding self adjustable delay element 85–88 along sense lines 81–84. When a clock edge propagating on a feed forward trace 71–74 reaches a digital subsystem 76–79, a reflection of the same clock edge is generated which then travels along the same feed forward trace back toward the clock distribution apparatus 75. Each self adjustable delay element 85–88 senses a voltage change on its sense line 81–84 associated with the returned reflected clock edge at the external terminating resistance 96–99 and thereby establishes a round trip propagation time for the clock edge from which it determines the required delay needed to reduce clock skew. Although this method eliminates the difficulties and timing errors associated with having two closely placed clock traces per clock edge, it still requires two pins per clock edge output and thus still increases the physical dimensions of a clock distribution apparatus. Further, this method introduces an error to the determination of the round trip propagation time by observing the return of the reflected clock edge on sense lines 81–84 at the far side of an external terminating resistance 96–99 instead of when the clock edge reaches the clock distribution apparatus 75.

An object of the present invention is to devise an accurate timing event distribution apparatus which is self-regulating, requires one transmission line per destination subsystem component, and uses only one pin per clock edge output.

SUMMARY OF THE INVENTION

The above object has been met with a clock distribution apparatus that allows a timing event to arrive simultaneously at multiple destination subsystem components at their respective physical locations with a single transmission line per subsystem component without requiring custom trace routing. Further, there is no need to program a device. The circuit of the present invention employs an element in series with each transmission line that can shift the occurrence in time or phase of the timing event. The circuit is capable of adjusting a phase shift of each of its individual outputs such that a timing event arrives at each destination subsystem component at essentially the same time.

The apparatus of the present invention measures the round trip propagation time, $T_{round\_trip}$, of a timing event from the apparatus to a destination subsystem component and back to the apparatus for each transmission line. The forward propagation time, $T_{fpd}$, from the apparatus to a respective destination subsystem component is half the measured round trip time. The circuit stores the measured propagation time to each destination subsystem component and shifts the occurrence in time of the clock edge, or timing event, at each output independently as required to achieve simultaneous arrival of the timing events at each of the respective destination subsystem components and thereby eliminates clock skew.

A transmission line structure, specifically a source series terminated transmission line, that induces a reflection from a destination subsystem back to the apparatus, is employed in the clock distribution system of the present invention. The arrival of the reflection is detected by means of a current mirror. Current will flow into a source series terminated transmission line as long as there exists a propagating wave within the transmission line. The invention is such that a reflected clock edge arriving at the apparatus sees a matched terminated impedance thus terminating wave propagation within the transmission line. By monitoring the current flow, the invention is able to determine the exact time when a reflected wave arrives at the apparatus. The advantage of this invention over the fifth method cited in the above is that the present invention monitors the current supplied by an output driver to a source series terminated transmission line to sense a reflected wave on the same source series terminated transmission line used by the forward wave and hence no extra sense line is required. Further, the error in $T_{round\_trip}$ of method six introduced by monitoring for a reflected clock edge at the far side of an external terminating resistance instead of at the output of the apparatus is eliminated.

The apparatus is configured in a system having one destination subsystem for each output node. The apparatus contains one timer unit per output which is activated when a timing event is launched and stopped when the corresponding reflection arrives at the apparatus. The elapsed time is equal to the round trip propagation time, $T_{round\_trip}$, from the apparatus to the respective destination subsystem component and back. In one embodiment of the invention, the time shift element is an adjustable delay element where the amount of delay, $T_{delay}$, is adjusted using an incorporated computational device to solve the following equation for $T_{delay}$:

$$T_{delay} = T_{delay\_max} - T_{round\_trip}/2. \qquad \text{Eq. (2)}$$

where $T_{delay\_max}$ is the maximum delay time an adjustable delay element can achieve.

The present invention thus shifts the occurrence in time of a clock edge or timing event at each output node by an amount such that each destination subsystem component receives the timing event at the same time. This time shift sets $T_{skew}$ equal to zero, and permits minimizing a clock cycle period and maximizing overall system speed.

It is also possible for each transmission line connected to each destination subsystem component to have a different frequency of clock edges by, for example, inserting a frequency divider after the clock edge source and before the adjustable delay element.

When the clock distribution apparatus is first activated, it requires a discrete amount of time to determine and adjust the necessary delay for each adjustable delay element. For this reason, a non-volatile memory used as a charge storage element to store an analog voltage level may be associated with each adjustable delay element such that the apparatus may record the necessary delay for each adjustable delay element in the non-volatile memory. In this way, the apparatus will already know the delays needed for each adjustable delay element to eliminate clock skew when power is re-applied.

BRIEF DESCRIPTION OF THE DRAWINGS

FIG. 8 is a plan view of an idealized source series terminated transmission line for carrying a clock edge in accord with the present invention.

FIGS. 9A–9D show timing event signal waveforms for the circuit of FIG. 8.

BEST MODE OF CARRYING OUT THE INVENTION

Figure 1:
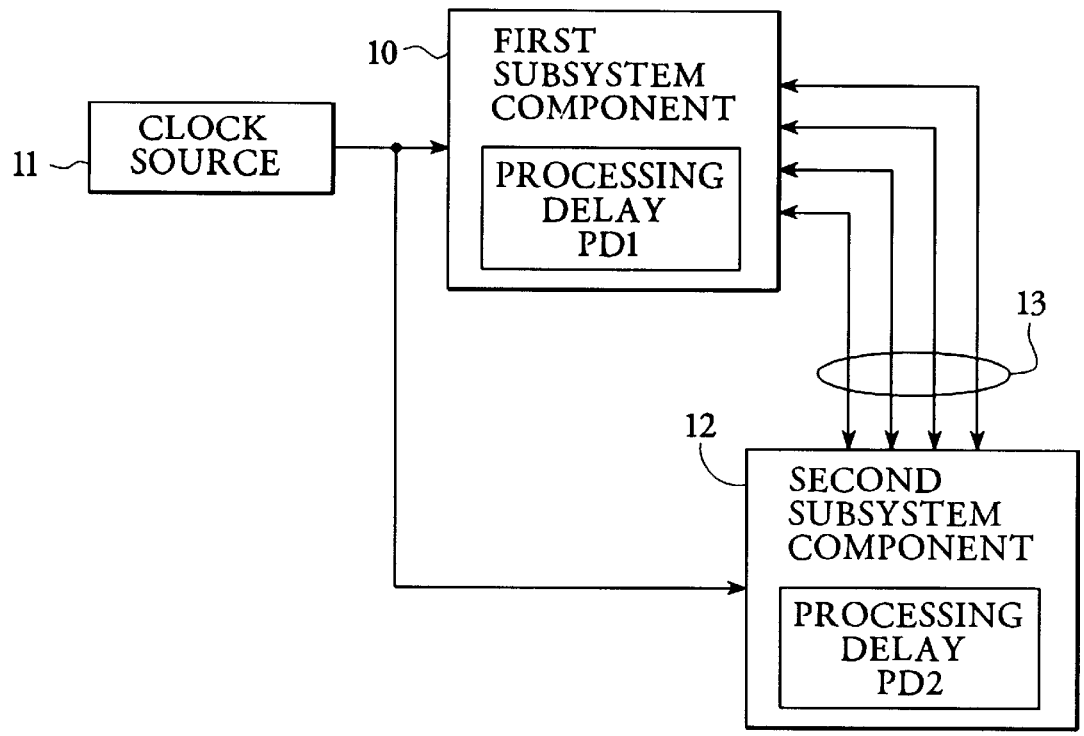
FIGS. 1–7 are plan views of various clock distribution circuits of the prior art.
Figure 2:
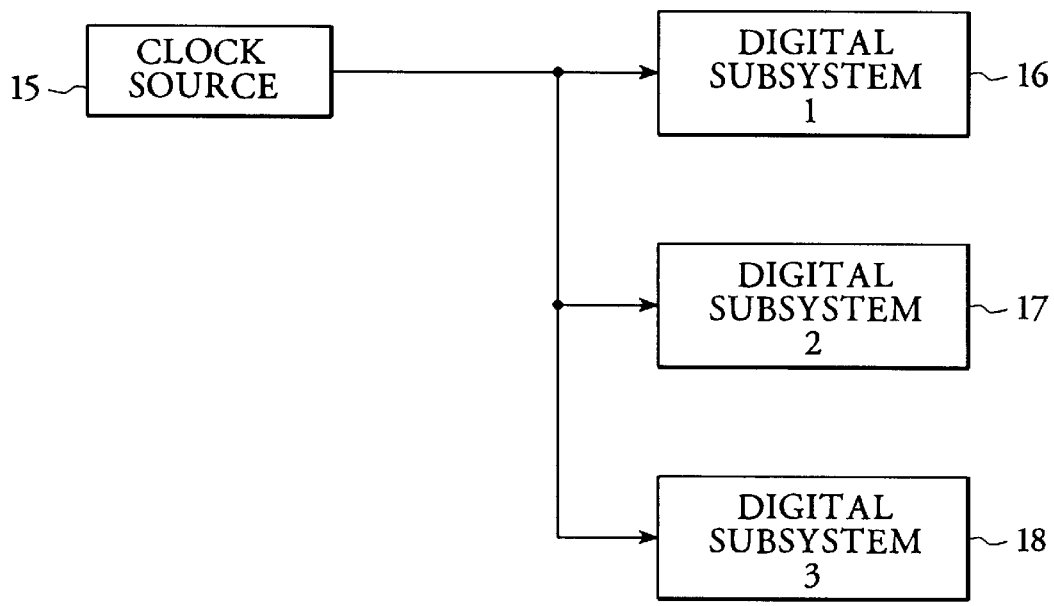
Figure 3:
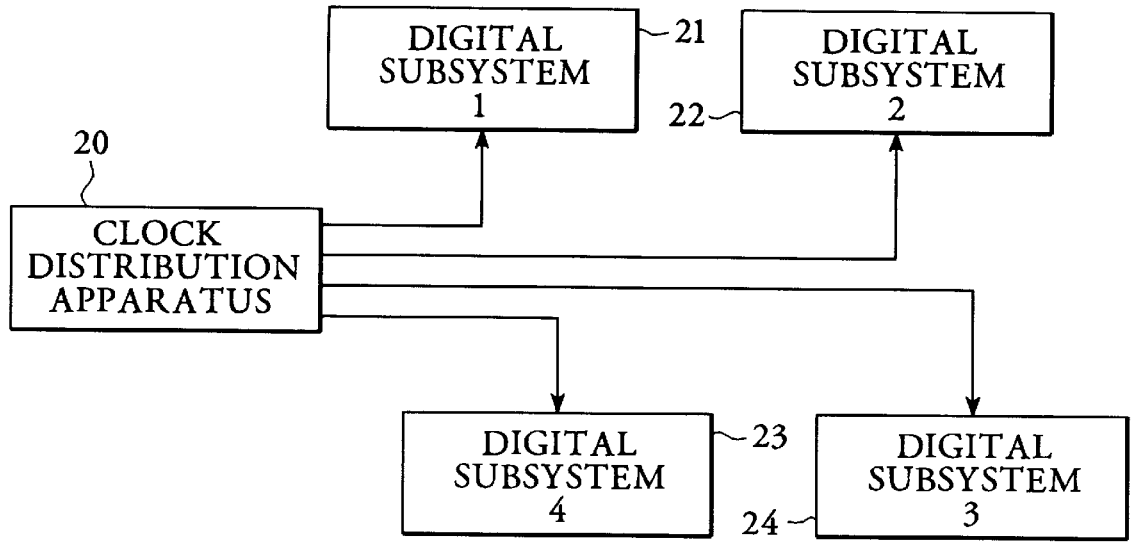
Figure 4:
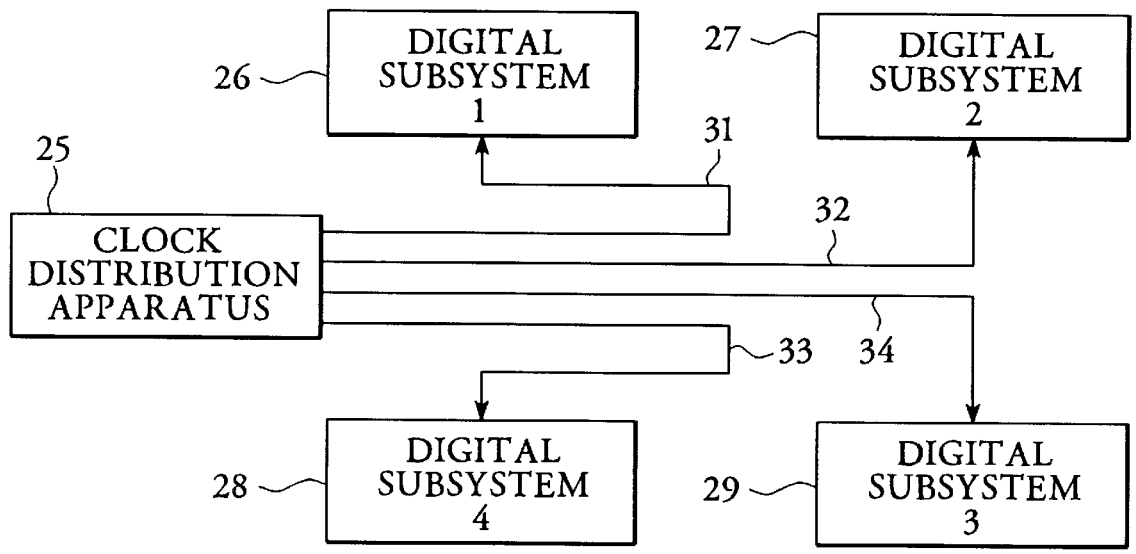
Figure 5:
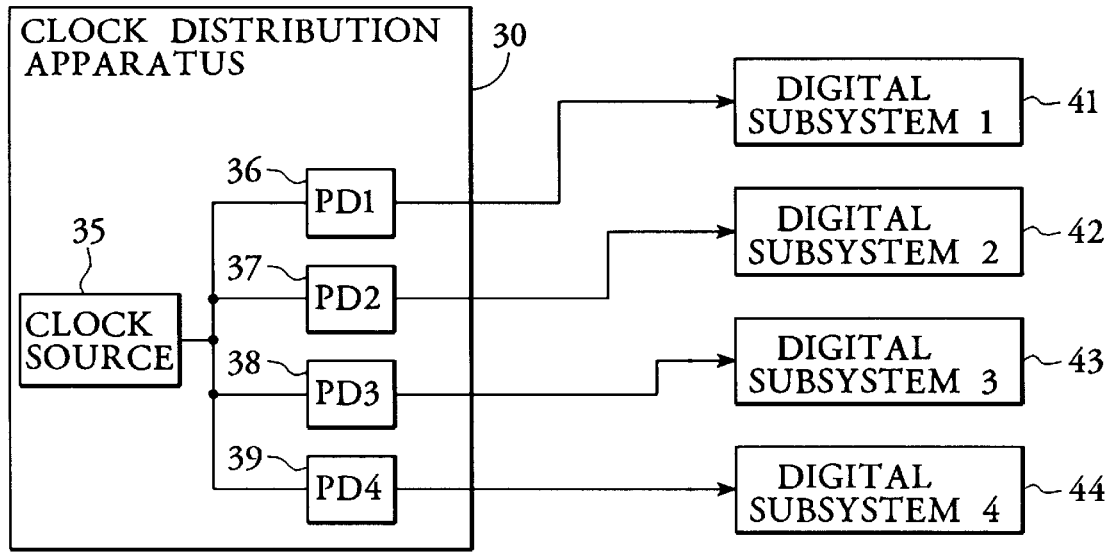
Figure 6:
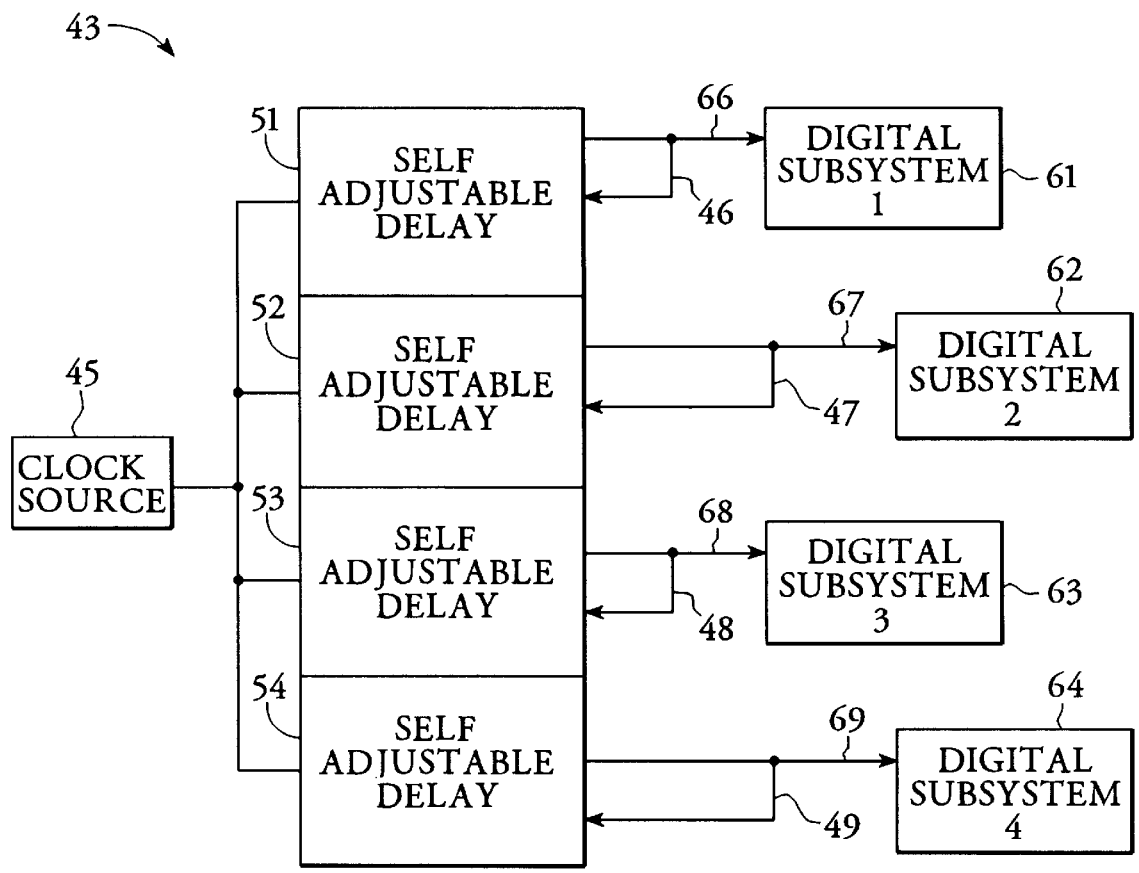
Figure 7:
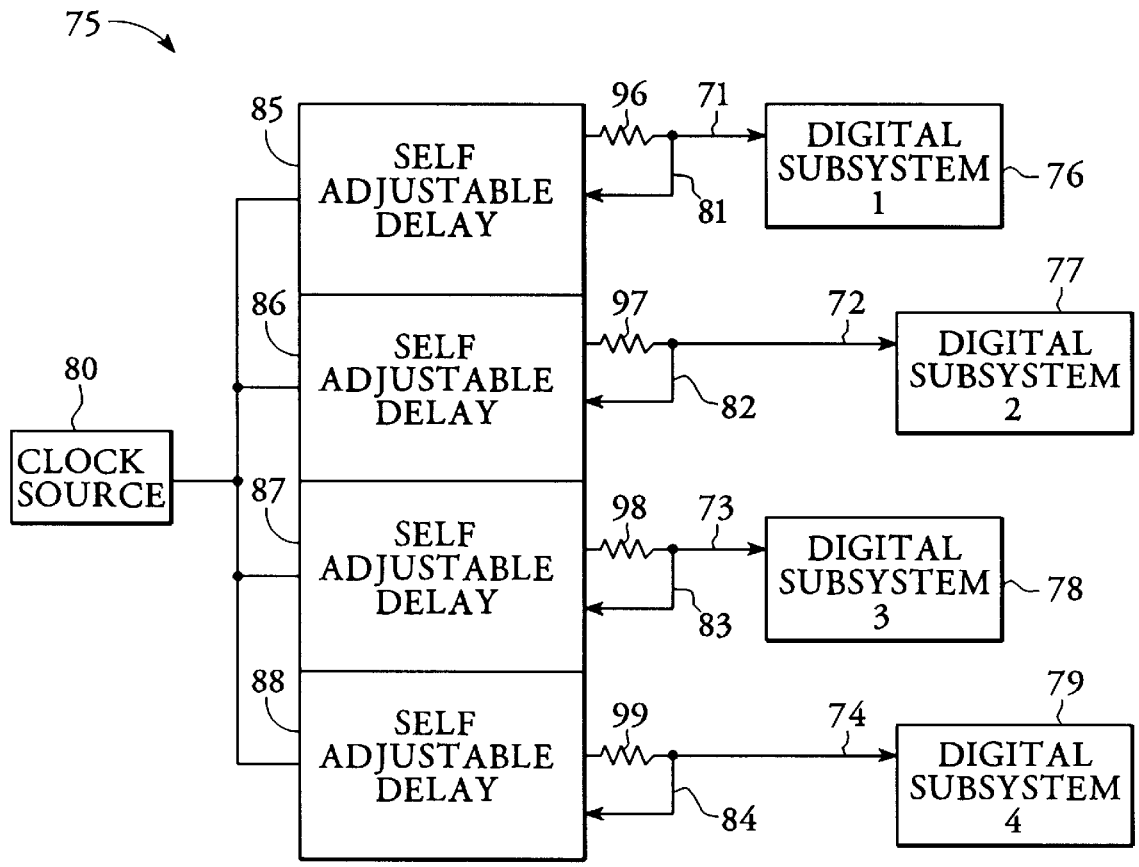

In this description, a timing event is characterized physically by a change in voltage or current. The voltage or current change occurs on each output of a clock distribution apparatus. This voltage change must propagate to a destination subsystem via an electrical connection, such as a coaxial cable or copper trace. The voltage change is an electromagnetic wave that propagates along the electrical connection.

In the present invention, the electrical connection is designed to have a transmission line structure with reflective transmission line properties. The wave propagates according to the established theory of the physics of such structures. This theory is presented in Ramo, Whinnery, and Van Duzer, "Fields and Wave in Communication Electronics", John Wiley and Sons, Inc., 1965, pp. 23–51, pp. 322–366, pp. 371–482 and is incorporated herein by reference. When the wave reaches the destination subsystem, a reflection is purposely induced.

This invention requires a reflection to be present, further the invention is best suited for use with a source series terminated transmission line as shown in FIG. 8. The propagation of a voltage or current edge is terminated after an initial round trip by choosing a transmission line structure such that a reflected wave sees a terminating resistance 103 which is exactly equal to the characteristic impedance Z0 of the transmission line 105 eliminating any subsequent reflections. The described no reflection condition is referred to as a matched termination. A matched terminating impedance is placed at each output of the clock distribution apparatus in series with each transmission line. In the source series terminated transmission line structure of FIG. 8, the clock distribution device 101 using a low impedance output driver sends a voltage edge timing event, $V_{src}$, through a source series termination resistor R0 103 and a transmission line 105 with a characteristic impedance value of Z0 to a load ZL 107. R0, the source series terminating resistor, is chosen to equal Z0 and thereby create a matched termination.

With reference to FIG. 9A, a clock voltage edge initiated by the clock distribution apparatus 101 will quickly rise to a value $V_{src}$. However, with R0 chosen to equal Z0, the clock voltage edge divides in half across R0 and Z0 raising V1 of FIG. 9B to a value of $V_{src}/2$ and then becomes a forward propagating voltage edge traveling toward the load ZL 107. According to the laws of wave propagation, when a forward traveling wave arrives at an open circuit, a reflected wave of equal amplitude is generated and sent propagating back toward the source. The voltage at any point on the transmission line is the sum of the forward and reflected wave. The load impedance ZL 107 at the end of the line is essentially an open circuit and, as shown in FIG. 9C, it causes a reflected wave of equal amplitude whose voltage value is added to the forward propagating wave, resulting in a total voltage twice as high as the forward propagating wave. The voltage at $V_{Load}$ therefore rises from 0V to a value equal to $V_{src}$ at a point in time equal to the forward propagating time, $T_{fpd}$, from the clock distribution device 101 to the load 107. The reflected wave then propagates back toward the source of the line, the clock distribution device 101. With reference to FIG. 9B, when the reflected wave arrives at R0 103, it will raise V1 to a value equal to $V_{src}$ and encounter a source series termination of R0=Z0 which according to the laws of wave propagation will cause it to terminate without another reflection being induced.

By noting when a clock edge is initiated at the output of the clock distribution device 101 and sensing when the reflected wave arrives back at the output, the clock distribution device 101 can gain a measure of the round trip propagation time, $T_{round\_trip}$. Half the value of $T_{round\_trip}$ would then equal the forward propagation delay time $T_{fpd}$, $T_{fpd}=T_{round\_trip}/2$, from the clock distribution device 101 to the load, ZL 107. Knowing the forward propagation delay time, the clock distribution device 101 can then determine the required time delay needed to be added to a clock edge to eliminate clock skew.

When a clock edge is launched, a current begins to flow into transmission line 105 and when the reflection returns the current flow stops. The starting and stopping of this current flow corresponds to a rising and falling edge, respectfully, in a current waveform. One method to measure $T_{round\_trip}$ is to simply monitor the output current edge, $I_{src}$.

An idealized current flow from the clock distribution device 101 is depicted in FIG. 9D. In FIG. 9D, the initiation of current, $I_{src}$, from the distribution device 101 is coincident with the initiation of a clock edge $V_{src}$. Further, the termination of current $I_{src}$ from the output is likewise coincident with the termination of the reflected wave. These edges can be used to start and stop a time measurement unit. This time measurement unit will in turn be a mirrored representation of $T_{round\_trip}$. However, transmission line structures often have less than ideal characteristics such as discontinuities in Z0 and cross talk. These non-ideal characteristics produce an unpredictable current edge waveform in the transmission line which can, if used directly, result in false indications that a reflection has returned.

The preferred method of sensing a reflected wave is to monitor the charge on transmission line 105. A quantized amount of charge, $Q_{state}$, is required to change the logic state of transmission line 105 from, for example, a logic low to a logic high. For each output node, the value of $Q_{state}$ is relatively fixed. If the charge flow is monitored, the clock distribution apparatus will know the reflected wave has arrived when a charge $Q_{state}$ has been output. This method differs from the previously described method by not monitoring a current edge directly but instead monitoring the amount of charge required to change the logic state of the transmission line from, for example, a logic low state to a logic high state.

Figure 10:
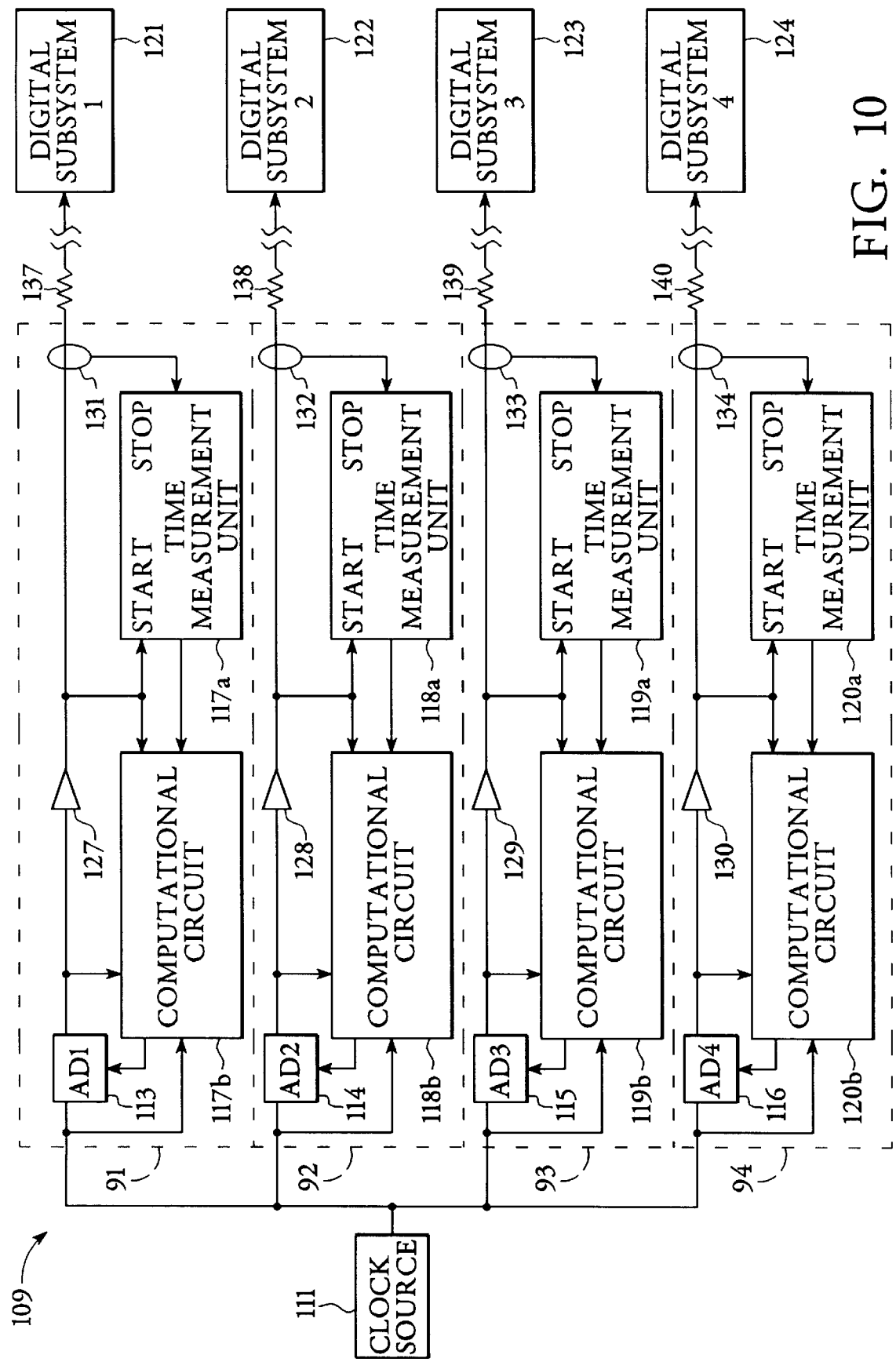
FIG. 10 is a plan view of a clock distribution circuit in accord with the present invention.

FIG. 10 shows a clock distribution apparatus 109 utilizing skew minimizing phase shift blocks 91–94 in accord with the present invention. The clock distribution apparatus 109 receives an input from a clock source 111 which is connected to multiple adjustable delay elements AD1–AD4, 113–116 respectively, and a corresponding computational circuit 117b–120b. The adjustable delay elements 113–116 receive a control input from their corresponding computational circuit 117b–120b which outputs a voltage proportional to an amount of delay desired, $T_{AD}$. Upon leaving an adjustable delay element 113–116, an output driver 127–130 sends the clock edge through an external resistance 137–140 to a destination digital subsystem 121–124. The external resistances 137–140 are chosen to match the characteristic impedance of their corresponding external line to form a source series terminated transmission line as described above.

The computational circuits 117b–120b in combination with time measurement units 117a–120a determine the amount of delay needed to eliminate clock skew. Each time measurement unit 117a–120a receives a starting input from an output driver 127–130 and a stopping input from a current mirror 131–134 which is representative of the flow of current from the output driver 127–130. Each time measurement unit 117a–120a first starts tracking time when its corresponding output driver 127–130 initiates launching of a clock edge. At this point, the current mirror 131–134 initiates a flow of current to the time measurement unit 117a–120a indicating the existence of a flow of current from the output driver 127–130. The time measurement unit 117a–120a will continue to track time until current from the current mirror drops below a predetermined value representative of completion of a logic state change. The clock edge will propagate to a digital subsystem 121–124 and back to the clock distribution apparatus 109 where it will terminate. Coincident with the termination of the propagating clock edge will be the termination of current from the output driver 127–130 and its corresponding current mirror 131–134 thereby giving a stopping signal to the time measurement unit 117a–120a.

Figure 11:
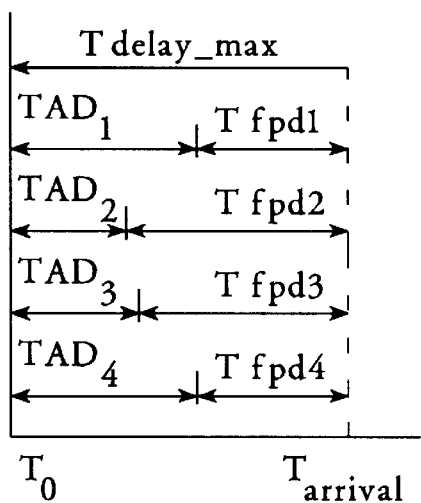
FIG. 11 is a timing diagram for the circuit of FIG. 10.
Figure 12:
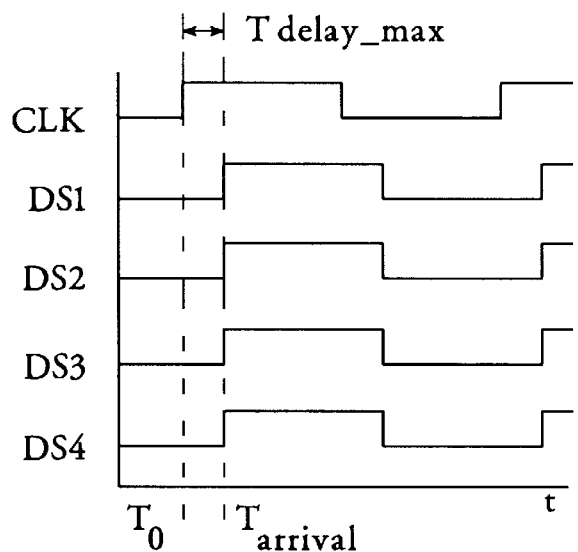
FIG. 12 is a timing diagram for the circuit of FIG. 10 depicting the occurrence of a timing event at a destination subsystem with respect to a clock source.

With knowledge of the round trip propagation time of a clock edge, each computational circuit 117b–120b may then determine the amount of delay needed by a corresponding adjustable delay element AD1–AD4, 113–116. Each computational circuit 117b–120b is made to know a maximum adjustable time delay for the clock distribution apparatus 109, $T_{delay\_max}$ of FIG. 11. Half the value of the round trip time is equal to the forward propagation delay, $T_{fpd}$, for each output. The difference between the $T_{delay\_max}$ and the forward propagation delay, $T_{fpd}$, is the amount of delay $T_{AD}$ needed by an adjustable delay element 113–116 in order to assure that the arrival times, $T_{arrival}$, of a clock edge at each digital subsystem 121–124 is the same for all digital subsystems 121–124. As seen in FIG. 12, the result is that each digital subsystem, DS1–DS4, will receive a clock edge simultaneously, although this clock edge will be out of phase with the clock source, CLK, by an amount equal to $T_{delay\_max}$.

Figure 13:
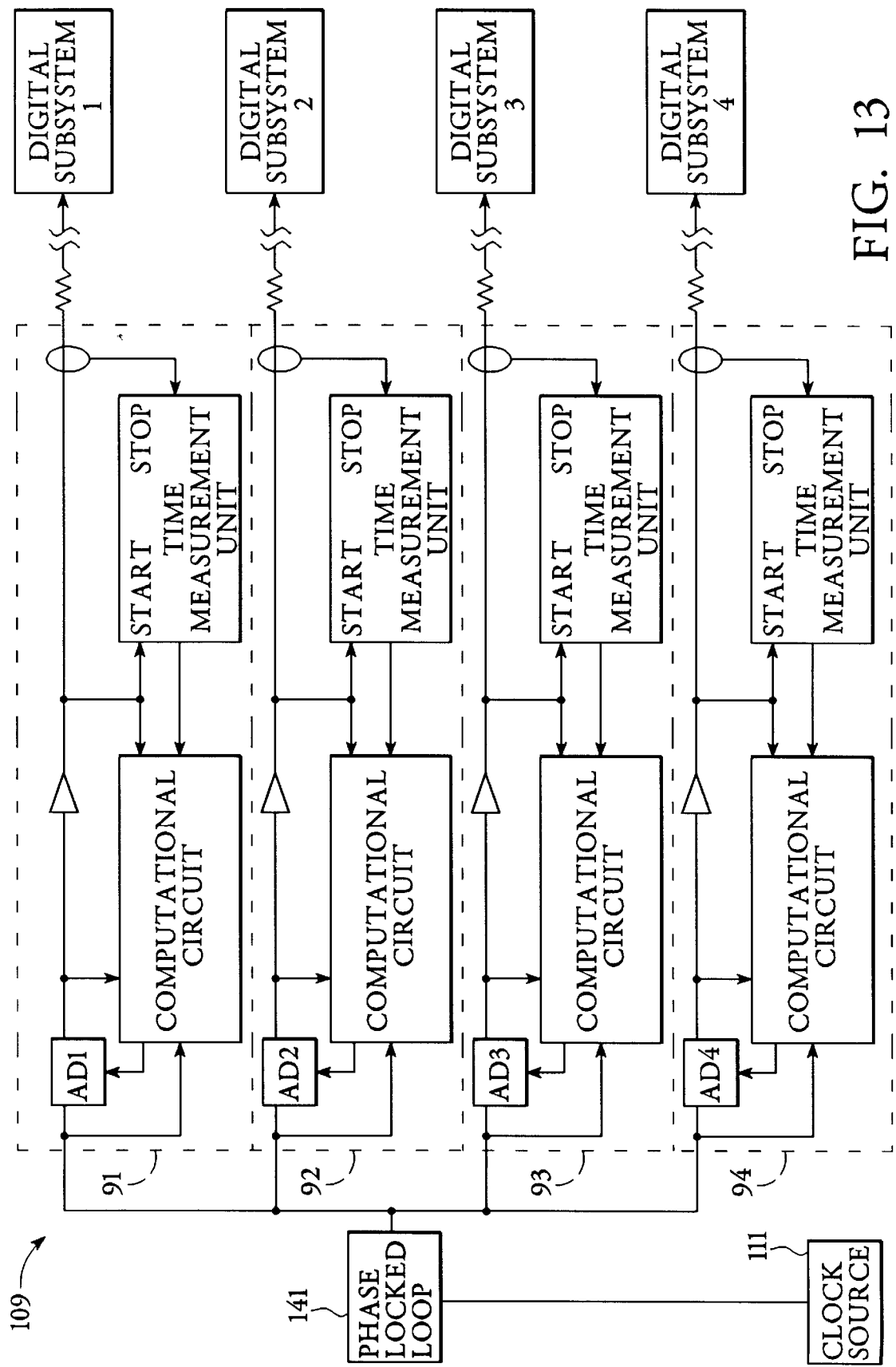
FIG. 13 is a plan view of an alternate clock distribution circuit in accord with the present invention.
Figure 14:
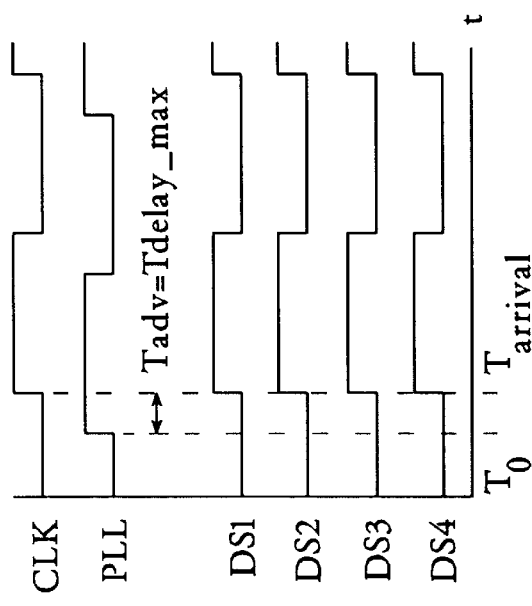
FIG. 14 shows timing diagrams for the circuit of FIG. 13.

In an alternative embodiment of the invention, the clock distribution apparatus 109 may be constructed as shown in FIG. 13. In this embodiment, a phase-locked loop 141 is inserted between the clock source 111 and each phase shift block 91–94. With reference to FIG. 14, the phase-locked loop, PLL, delays or advances forward in time, the edge from the clock source, CLK, by an amount $T_{adv}$ equal to $T_{delay\_max}$ of the clock distribution apparatus 109 of FIG. 13. Each phase shift block 91–94 receives the shifted clock edges from the phase-locked loop, 141, at time $T_0$ and proceeds to add a delay such that each destination subsystem DS1–DS4 of FIG. 14 receives the clock edge simultaneously, as described above. Thus, at each subsequent clock edge from the clock source, CLK, the arrival time, $T_{arrival}$, of a clock edge at DS1–DS4 will coincide with the clock source, CLK. The use of a phase-locked loop allows multiple parallel and series cascaded clock distribution apparatuses to achieve a large simultaneous system. If desired, the phase-locked loop can advance the phase by a different amount as system design needs might dictate.

Figure 15:
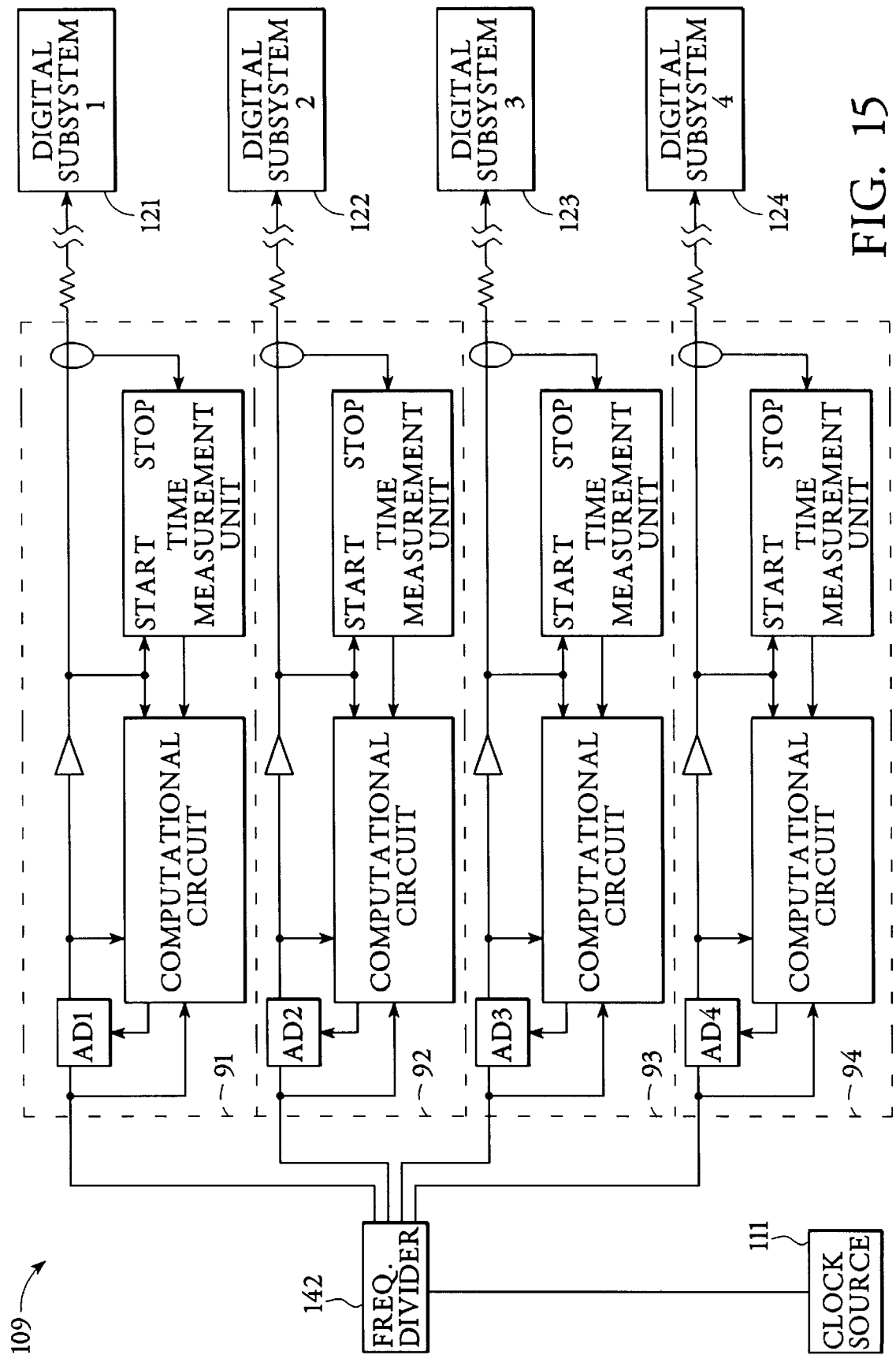
FIG. 15 is a plan view of an alternate clock distribution circuit in accord with the present invention.

In still another embodiment shown in FIG. 15, a frequency divider 142 is inserted between the clock source 111 and each phase shift block 91–94. The frequency divider 142 is capable of supplying a different frequency to each phase shift block 91–94. In this manner, the frequency of the clock source 111 may be made different for each digital subsystem 121–124.

Figure 16:
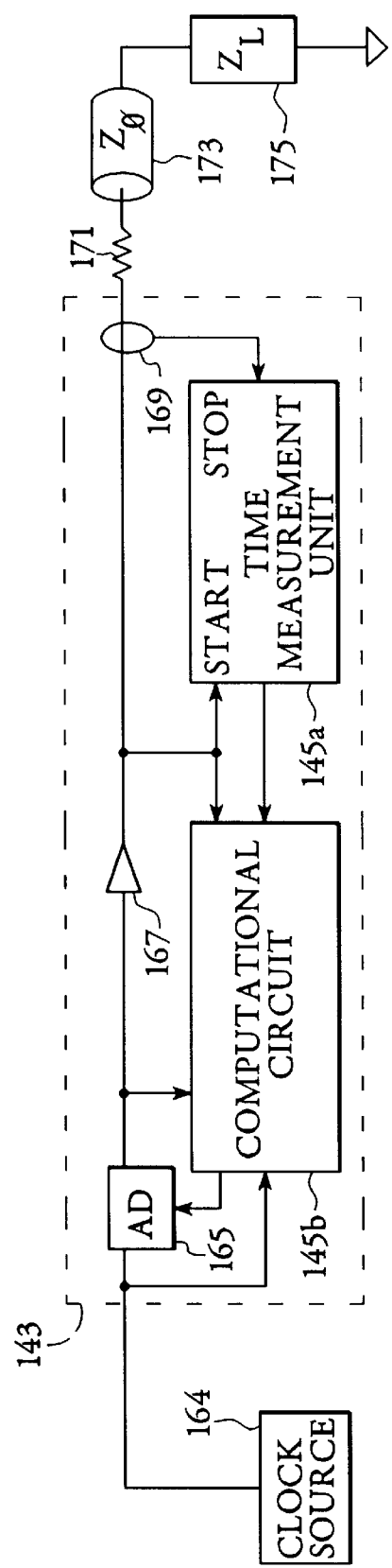
FIG. 16 is a plan view of a phase shift block in accord with the present invention.

FIG. 16 shows a phase shift block 143 in accord with the present invention. The phase shift block 143 consists of an adjustable delay element 165, an output driver 167, a current mirror 169, a time measurement unit 145a, and a computational circuit 145b. This circuitry may be digital or analog in nature, however an analog implementation allows for a high level of precision in a minimum of physical area. Clock source 164 sends a clock edge through the adjustable delay element 165 to the output driver 167 which incorporates current mirror 169. The clock edge then goes through a source series terminating resistance 171 and a transmission line 173 to reach a load impedance ZL 175.

The phase shift block 143 requires that the time measurement unit 145a provide a robust measurement of the round trip time, $T_{round\_trip}$, of a clock edge. The time measurement unit accomplishes this by measuring the amount of charge placed onto the transmission line 173. As mentioned earlier, a similar amount of charge is required to complete a logic state transition for each clock edge in a given transmission line. The total charge $Q_{state}$ delivered to the transmission line for each state transition is the mathematical integral of the current over the corresponding state transition. This relationship is described by the following equation which is well known in the art:

$$Q_{state} = \int I dt$$

Since it is the total, or the near total, charge $Q_{state}$ that determines when the transmission line has completed its logic state transition, and since this is repeatable with every state transition, the time measurement unit 145a does not suffer from the previously described errors incurred when relying on well behaved and smoothly transitioning current edges for determining the return of a reflected clock edge. Likewise, it does not suffer from any difficulties that may arise from relying on well-behaved voltage edges.

Figure 17:
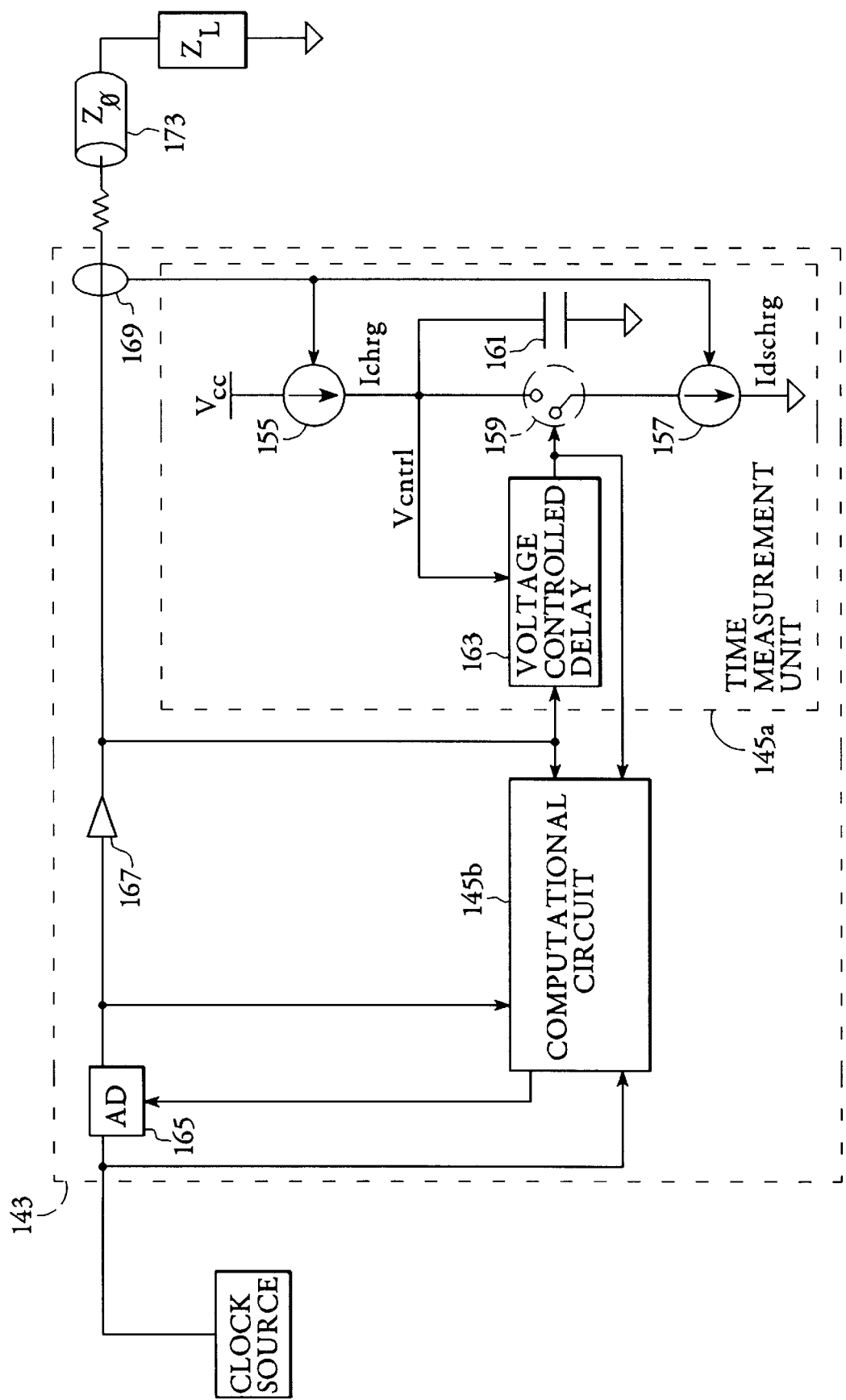
FIG. 17 shows the internal structure of the time measurement unit of FIG. 16.

The time measurement unit 145a is designed to start counting time when current flow begins and to stop counting time when an amount of charge equal to $Q_{state}$ is collected. With reference to FIG. 17, a phase shift block 143 is shown with an internal view of the time measurement unit 145a. The time measurement unit 145a consists of two current sources 155 and 157, a voltage controlled switch 159, a storage capacitor 161, and a voltage controlled delay 163. Both current sources 155 and 157 are active only while current is flowing into transmission line 173 as determined by current mirror 169.

When the output driver 167 launches a clock edge, $I_{chrg}$ 155 starts flowing. $I_{chrg}$ is a mirrored version of the output driver current, but does not necessarily equal the magnitude of the output driver current. $I_{chrg}$ flows for the same time that the output driver current flows, and puts charge onto storage capacitor 161. As charge, Q, accumulates on the storage capacitor 161, the voltage across it, $V_{cntrl}$, increases according to the formula V=Q/C where C is the capacitance of storage capacitor 161 and V is the voltage across it.

$I_{dschrg}$ 157 is also a mirrored version of the output driver current. $I_{dschrg}$ may have the same magnitude as $I_{chrg}$, but $I_{dschrg}$ must have the opposite polarity of $I_{chrg}$ and thereby remove charge from storage capacitor 161. $I_{dschrg}$ also begins to flow when the output driver current and $I_{chrg}$ begin to flow, however $I_{dschrg}$ stops flowing once the clock edge from the output driver 167 has propagated through the voltage controlled delay 163. The propagation time of the voltage control delay 163 is in turn controlled by the voltage across storage capacitor 161, $V_{cntrl}$.

Switch 159 is made to be conducting at the launch of a new clock edge by the output driver 167. Therefore $I_{dschrg}$ is acting to discharge storage capacitor 161 from the time a clock edge is launched by the output driver 167, until the clock edge propagates through the voltage controlled delay 163, at which time switch 159 becomes non-conducting. Initially when $V_{cntrl}$ is a low voltage, ≈0V, the delay through 163 is at its minimum value which is made to be small in comparison to $T_{delay\_max}$. This results in a minimum $I_{dschrg}$ and consequently a minimum amount of charge being removed from storage capacitor 161. Therefore, $V_{cntrl}$ will rise in value provided $I_{chrg}$ is on for a longer period of time than $I_{dschrg}$. Given a transmission line of any appreciable length, e.g. greater than 100 picosecond in delay length, $I_{chrg}$ will be on for a longer duration than $I_{dschrg}$ and consequently $V_{cntrl}$ will increase in value. As $V_{cntrl}$ rises $I_{dschrg}$ is on for an increasingly longer time until an equilibrium is reached where the increase in $V_{cntrl}$ by $I_{chrg}$ is just countered by a decrease in $V_{cntrl}$ by $I_{dschrg}$. As $V_{cntrl}$ increases in voltage, the delay through 163 increases correspondingly in time. $V_{cntrl}$ continues to increase until such time that the delay through 163 equals $T_{round\_trip}$, at which point both current sources $I_{dschrg}$ and $I_{chrg}$ will be on for an equal amount of time. This results in the amount of charge removed by $I_{dschrg}$ being equal to the amount of charge accumulated by $I_{chrg}$ and consequently $V_{cntrl}$ ceases to rise in value.

If $V_{cntrl}$ were to be at an initial high voltage, corresponding to a time greater than $T_{round\_trip}$, $I_{chrg}$ and $I_{dschrg}$ would again be on for an equal amount of time. When $I_{chrg}$ and $I_{dschrg}$ are made of equal magnitude and are both on for equal times it is possible that no net charge Q is either removed or added to the capacitor. This can therefore result in $V_{cntrl}$ remaining stuck at its initial high value, when it should be reduced in value to reflect a smaller $T_{round\_trip}$. One method of avoiding this condition is to make $I_{dschrg}$ slightly greater than $I_{chrg}$ which ensures that $V_{cntrl}$ can always be reduced in value, and thus eliminates this stuck high condition. However, after an equilibrium condition has been reached, that is when $V_{cntrl}$ is neither increasing nor decreasing in voltage, it is apparent that $I_{dschrg}$ will be removing more charge than if $I_{dschrg}$ were to equal $I_{chrg}$. For $V_{cntrl}$ to once again reach equilibrium, the circuit must compensate for the slightly larger $I_{dschrg}$ by reducing the delay through voltage controlled delay 163. The time measurement unit 145a therefore servos to a slightly lower value of $V_{cntrl}$. This introduces a slight offset in this circuit's measurement of the round trip time, $T_{round\_trip}$. The offset may be negligible, but if one wishes to eliminate the offset, it can be removed by introducing a similar compensating offset into the computational circuit 145b as explained below.

Figure 18:
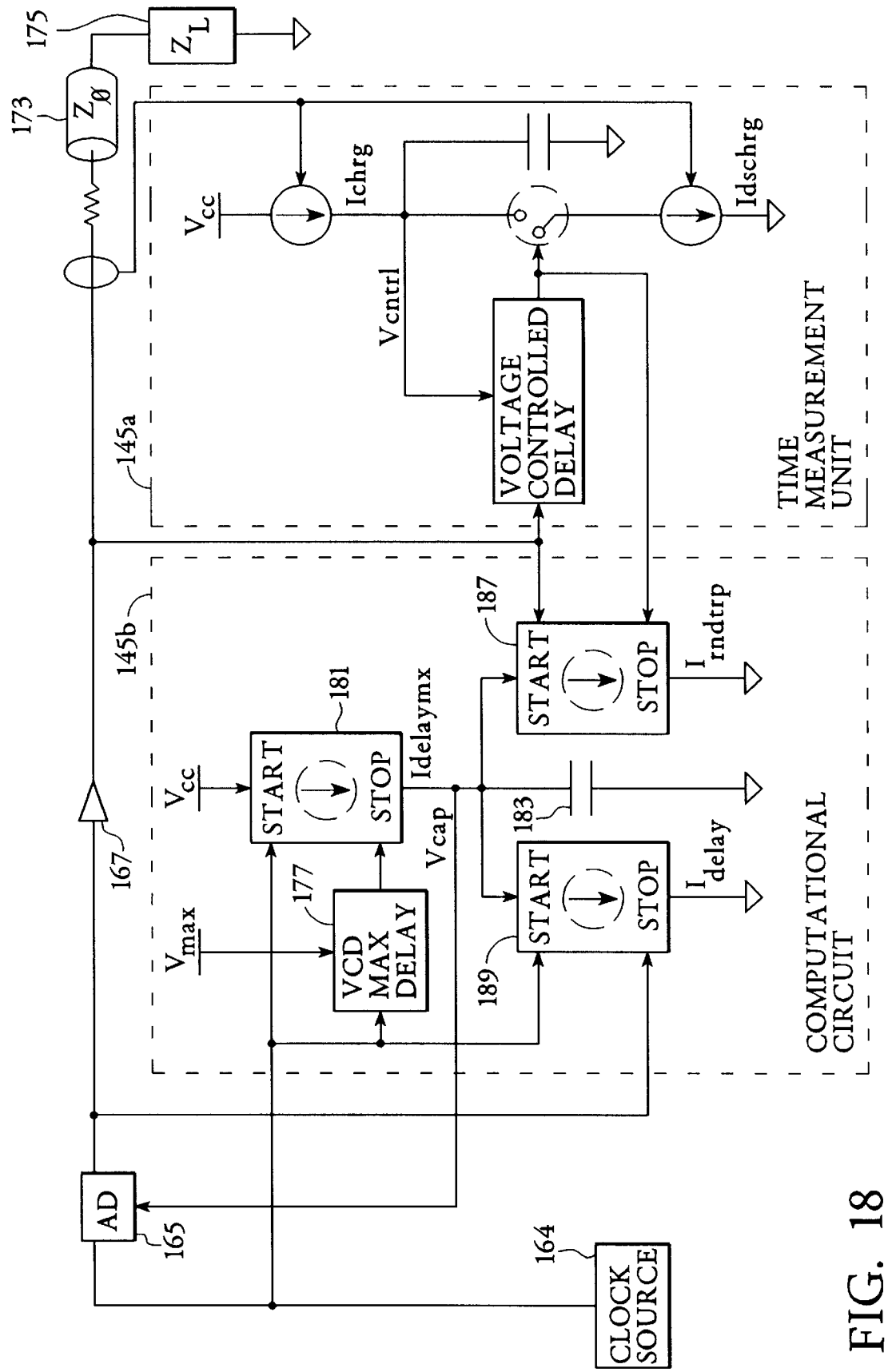
FIG. 18 shows the internal block structure of the computational circuit shown in FIG. 16.

FIG. 18 shows an internal description of the computational circuit 145b. The computational circuit 145b associated with the time measurement unit 145a of this embodiment maintains a balance of charge on a second storage capacitor 183 through the use of three modules controlling three different current sources; $I_{delaymx}$ 181, $I_{rndtrp}$ 187, and $I_{delay}$ 189.

The first module consists of a reference voltage controlled delay, 177, which is always set to the maximum allowable delay, $T_{delay\_max}$. It controls current source $I_{delaymx}$ 181 to charge the second storage capacitor 183. $I_{delaymx}$ 181 is turned on and off by two input control signals. It receives its start signal at the initiation of a timing event by the clock source 164 and receives its stop signal from the reference voltage controlled delay 177 once the maximum allowable delay, $T_{delay\_max}$, has elapsed. $I_{delaymx}$ 181 is activated once for each clock edge of the clock source 164, and is maintained active for a duration equal to the maximum delay time, $T_{delay\_max}$. This means the second storage capacitor 183 receives a charge of $Q_{delay\_max}$ and therefore a voltage proportional to the maximum allowable delay, $T_{delay\_max}$.

The second module of the circuit comprises a second current source, $I_{rndtrp}$ 187, that is active for a period equal to the round trip propagation time, $T_{round\_trip}$, as determined by the time measurement unit 145a. It is used to discharge the second storage capacitor 183. $I_{rndtrp}$ 187 is controlled by a second pair of control signals. It receives its start signal when a clock edge is launched by output driver 167, and receives a stop signal from the time measurement unit 145a after a time of $T_{round\_trip}$. Because $I_{rndtrp}$ 187 is active for the entire round trip propagation time of a clock edge, it would ideally be chosen to have a magnitude equal to half $I_{delaymx}$ 181. In this manner, the balance of charge on the second storage capacitor 183 at the end of a round trip time due to $I_{delaymx}$ and $I_{rndtrp}$ would be equal to the amount of charge that would be placed on the second storage capacitor 183 by $I_{delaymx}$ alone during the forward propagation time, $T_{fpd}$. This would leave a charge on the second storage capacitor 183 proportional to the desired amount of delay, $T_{delay}$, for the adjustable delay element 165 as determined by the previously described formula:

$$T_{delay} = T_{delay\_max} - T_{round\_trip}/2 \qquad \text{Eq. (2)}$$

But, as explained above, the time measurement unit 145a may introduce a small offset into the measurement of $T_{round\_trip}$. Following this method, $I_{rndtrp}$ 187 is made to have a compensating offset and is therefore made slightly stronger. Preferably, $I_{rndtrp}$ is made stronger by the same percentage as $I_{dschrg}$ is made stronger than $I_{chrg}$ in the time measurement unit 145a. Without this offset being introduced, the result of $V_{cntrl}$ in the time measurement unit 145a being offset on the low side is to cause $V_{cap}$, of the computational circuit 145b, to be offset but slightly on the high side. This occurs because the charge removed from the second storage capacitor 183 by $I_{rndtrp}$ would be less than would otherwise have been removed had the time measurement unit 145a not introduced an offset. The reason for introducing a second offset is to increase $I_{rndtrp}$ of the computational circuit 145b to remove the equivalent charge that results in a correct value of $V_{cap}$ across the second storage capacitor 183.

The third module of the circuit comprises a third current source $I_{delay}$ 189 made of equal magnitude as $I_{delaymx}$ and used to discharge the second storage capacitor 183. $I_{delay}$ is active for a period equal to the amount of delay set by the adjustable delay element 165. $I_{delay}$ 189 receives its start signal from the clock source 164, and its stop signal from the adjustable delay element 165, thus maintaining $I_{delay}$ 189 active for a time equal to the delay set by the adjustable delay element 165. $I_{delay}$ 189 therefore removes an amount of charge, $Q_{delay}$, from the second storage capacitor 183 that is proportional to the time delay through 165, $T_{delay}$. The time delay through 165, $T_{delay}$, is proportional to $V_{cap}$. As $V_{cap}$ increases, $T_{delay}$ increases and therefore the charge, $Q_{delay}$, removed by $I_{delay}$ 189 increases, which eventually counters any further increase to $V_{cap}$. In this manner, a closed loop negative feedback system is established that allows $V_{cap}$ to increase to a voltage where the charge added by module 1, $Q_{delaymax}$, equals the charge removed by module 3, $Q_{delay}$, and module 2, $Q_{rndtrp}$. This equilibrium condition, that is when $V_{cap}$ has been servoed to its final value and ceases to increase or decrease in voltage, is described by the following equations.

$$Q_{delay\_max} = Q_{delay} + Q_{rndtrp} \qquad \text{Eq. (3)}$$

The relationship Q=(T)(I) which defines charge, Q, as the multiple of time, T, and current, I, is well known in the art. Using this relationship, equation 3 can be rewritten as:

$$(I_{delaymx})(T_{delay\_max}) = (I_{delay})(T_{delay}) + (I_{rndtrp})(T_{round\_trip}) \qquad \text{Eq. (4)}$$

Since the magnitude of $I_{delay}$ is made equal to $I_{delaymx}$ and the magnitude of $I_{rndtrp}$ is made equal to ½ $I_{delaymx}$, equation 4 can be written as:

$$(I_{delaymx})(T_{delay\_max}) = (I_{delaymx})(T_{delay}) + (I_{delaymx})(T_{round\_trip})/2$$

Which can be reduced to:

$$T_{delay\_max} = T_{delay} + T_{round\_trip}/2$$

and then rearranged to match equation 2, the desired result:

$$T_{delay} = T_{delay\_max} - T_{round\_trip}/2 \quad \text{Eq. (2)}$$

For a simplified functional description of the computational circuit, assume that the maximum allowable delay that can be added to the clock source 164 is 5 ns and that the second storage capacitor 183 has a capacitance of 1 farad. Further assume that $I_{delaymx}$ 181 and $I_{delay}$ 189 add and remove charge at a rate of 1 coulomb per nanosecond and that an increase of 1 volt across the second storage capacitor 183, resulting from an increase of 1 coulomb of charge, causes the adjustable delay element 165 to increase its delay by 1 ns.

FIG. 19 compares 4 charge, Q, versus time, T, plots for 4 different phase shift blocks of a clock distribution apparatus in accord with the present invention with an initial 1.5 cycles of the clock source 164. The clock signal shown in FIG. 19A has a 50% duty cycle and a period of 20 ns. The increases in charge on the second storage capacitor 183 are separated by vertical dashed lines to identify which current sources are active during the various stages of operation. The following discussion describes the current sources as operating in stages, but this is not crucial to the invention.

Figure 19A:
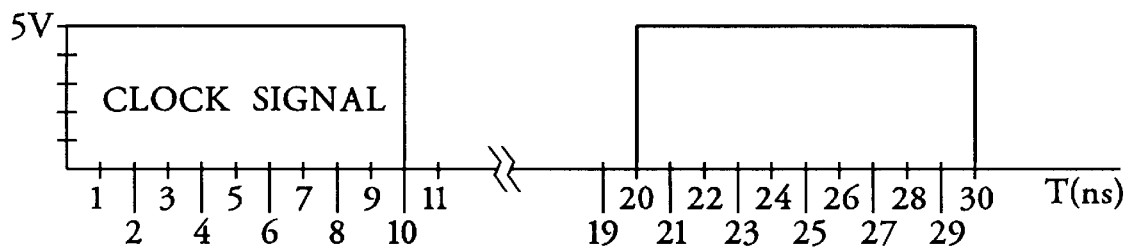
FIGS. 19A–19E show the charge distribution on the computational circuit capacitor shown in FIG. 18 during various phases of operation.
Figure 19B:
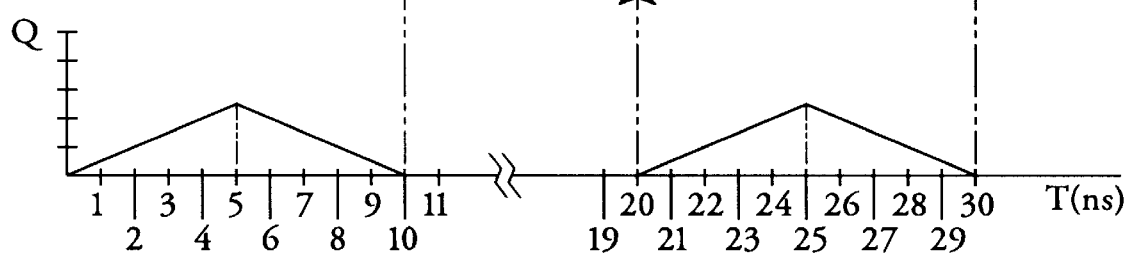

FIG. 19B plots the charge accumulation on storage capacitor 183 resulting from a transmission line 173 which has a propagation delay of 5 ns. In this case, the adjustable delay element 165 does not need to add any time delay to the clock source 164.

Starting with the rising edge of the clock source 164, $I_{delaymx}$ 181 and $I_{rndtrp}$ 187 will both be activated. Initially, storage capacitor 183 is discharged meaning that $V_{cap}$ is 0V and the adjustable delay element 165 is set to its minimum delay of about 0 ns. Because $I_{delay}$ 189 is active for a time equal to the delay through the adjustable delay element 165, $I_{delay}$ 189 is not active during the first clock cycle. During the first 5 ns, $I_{delaymx}$ 181 adds charge to storage capacitor 181 at a rate of 1 C/ns, but $I_{rndtrp}$ removes charge at half the rate, 0.5 C/ns, for a net charging rate of 0.5 C/ns. After the first 5 ns, the storage capacitor has 2.5 C and $I_{delaymx}$ 181 is turned off. But since $I_{rndtrp}$ 187 is active for a period equal to twice the forward propagation delay of the transmission line 173, it is active for an additional 5 ns during which it removes the 2.5 C previously stored on storage capacitor 183. At this point all three current sources 181, 187, and 189 are inactive and won't be activated until the next rising edge of the clock source 164 and therefore the charge on the storage cap 183 remains unchanged.

Upon the second rising edge of the clock source 164, the storage capacitor 183 is found to have 0V across it. Therefore, the voltage controlled delay 165 adds no delay to the clock edges 164 and a cycle similar to the first cycle is initiated.

Figure 19C:
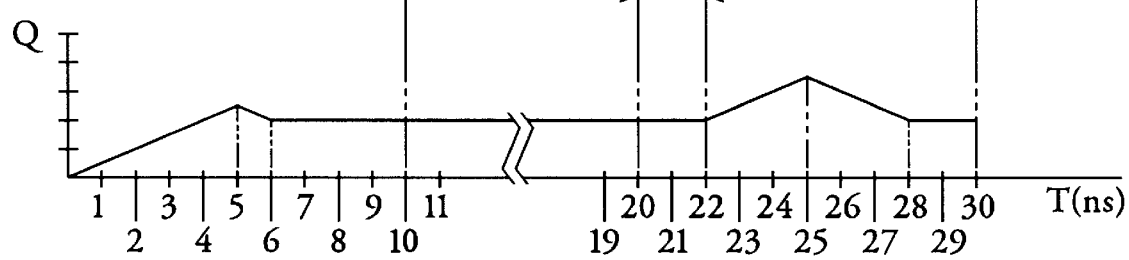

FIG. 19C shows the charge accumulated in the storage capacitor 183 resulting from a transmission line 173 which has a propagation delay of 3 ns. This means that the adjustable delay element 165 needs to add a 2 ns delay to the clock source 164 in order for the clock edge to reach its corresponding load ZL 175 in the expected 5 ns.

As before, $I_{delaymx}$ 181 and $I_{rndtrp}$ 187 become active with the initial rising edge of the clock source 164 and $I_{delay}$ 189 is not active during the first clock cycle. $I_{rndtrp}$ 187 will be active for twice the forward propagation delay of the transmission line, 6 ns, and $I_{delaymx}$ m 181 will be active for the maximum allowable delay of 5 ns. During the first 5 ns, the storage capacitor is charged to 2.5 C. $I_{delaymx}$ 181 is then deactivated but $I_{rndtrp}$ continues to be active for an additional 1 ns during which it will remove 0.5 C leaving a net charge of 2 C on storage capacitor 183. At this point all three current sources 181, 187, and 189 are inactive and won't be activated until the next rising edge of the source clock 164.

At the second rising edge of the clock source 164, the storage capacitor 183 has 2 C stored resulting in a 2V signal to the adjustable delay element 165 which then adds a 2 ns delay to the clock source 164. $I_{delaymx}$ 181 and $I_{delay}$ 189 are then both active for 2 ns after which $I_{delay}$ 189 is deactivated and $I_{rndtrp}$ 187 is activated. $I_{delay}$ 189 removes charge at the same rate that $I_{delaymx}$ 181 adds charge, and so for the first 2 ns the charge on storage capacitor 183 remains constant.

After 2 ns, the adjustable delay element 165 issues the delayed clock edge to output driver 167 and the start input of $I_{rndtrp}$ 185, thereby deactivating $I_{delay}$ 189 while activating $I_{rndtrp}$ 187.

Since $I_{delaymx}$ 181 had already been active for 2 ns and is limited to 5 ns, it will continue to be active for 3 more nanoseconds. During these 3 ns, $I_{delaymx}$ 181 and $I_{rndtrp}$ 187 add 1.5 C of charge to storage capacitor 183, but $I_{rndtrp}$ is active for an additional equal time of 3 ns and removes the previously added 1.5 C thus restoring the charge on storage capacitor 183 to its initial value of 2 C. The same process will begin with the following rising edge of the source clock 164, and so all subsequent clock edges will have an equivalent 2 ns delay.

Figure 19D:
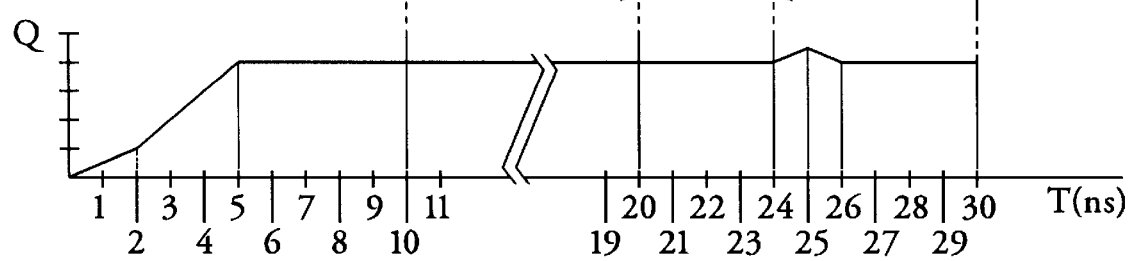

FIG. 19D shows the charge accumulated in storage capacitor 183 resulting from a transmission line 173 which has a propagation delay of 1 ns. This means that the adjustable delay element 165 needs to add a 4 ns delay to the clock source 164 in order for the clock edge to reach its corresponding load ZL 175 in the expected 5 ns.

Only $I_{delaymx}$ 181 and $I_{rndtrp}$ 187 are activated with the initial rising edge of the source clock 164. $I_{rndtrp}$ will be active for 2 ns, twice the propagation delay in the transmission line 173, and $I_{delaymx}$ 181 will be active for 5 ns. Therefore, 1.0 C is placed on the storage capacitor 183 during the first 2 ns. Following the deactivation of $I_{rndtrp}$ 187, $I_{delaymx}$ 181 continues to charge the storage capacitor 183 for an additional 3 ns bringing the total charge up to 4 C. At this point all three current sources 181, 187 and 189 are inactive and won't be activated until the next rising edge of the clock source 164.

At the second rising edge of the clock source, the 4V across the storage capacitor 183 causes the adjustable delay element 165 to delay the clock source 164 for 4 ns. $I_{delaymx}$ 181 and $I_{delay}$ 189 are both active for this 4 ns period and so the charge on the storage capacitor 183 remains constant.

After 4 ns, the adjustable delay element 165 issues the delayed clock signal to output driver 167 and the start input of $I_{rndtrp}$ 185, thereby deactivating $I_{delay}$ 189 and activating $I_{rndtrp}$ 187 for 2 ns.

$I_{delaymx}$ 181 will be active for 1 more nanosecond during which it and $I_{rndtrp}$ 187 add 0.5 C of charge to storage capacitor 183. But $I_{rndtrp}$ is active for an additional equal time of 1 ns and removes the previously added 0.5 C, and thus restores the charge on storage capacitor 183 to its initial value of 4 C. The same process will begin with the following rising edge of the clock source 164, and so all subsequent clock edges will have an equivalent 4 ns delay.

Figure 19E:
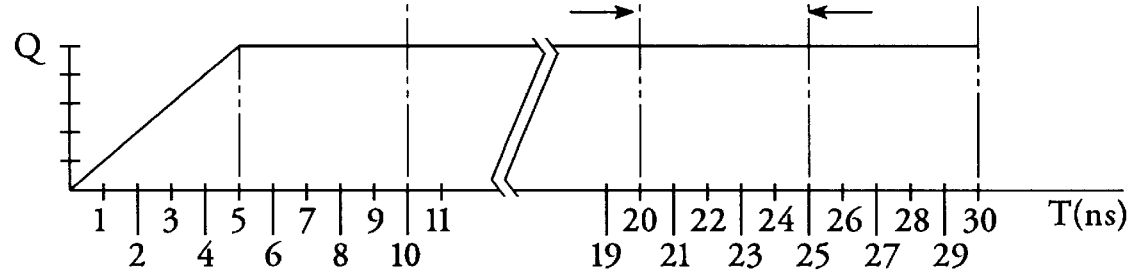

FIG. 19E shows the charge accumulated in storage capacitor 183 resulting from a transmission line 173 which has a zero propagation delay. This means that the adjustable delay element 165 needs to add a 5 ns delay to the clock source 164 in order for the clock edge to reach its corresponding load ZL 175 in the expected 5 ns.

Starting with the initial rising edge of the clock source 164, $I_{delaymx}$ 181 will be activated, but both $I_{delay}$ 189 and $I_{rndtrp}$ 187 will not be active. As before, $I_{delay}$ is not active during the first clock cycle. $I_{rndtrp}$ 187 is active for twice the propagation delay of the transmission line 173 but since the propagation delay is zero, $I_{rndtrp}$ 185 will likewise have an activation time of 0 ns. $I_{delaymx}$ 181, however, will be active for its required 5 ns during which it will store 5 C onto storage capacitor 183.

At the second rising edge of the clock source 164, the storage capacitor 183 has 5 C stored resulting in 5V across it which cause the adjustable delay element 165 to add a 5 ns delay to the clock source 164. Therefore, $I_{delaymx}$ 181 and $I_{delay}$ 189 are both active for the same amount of time, 5 ns. Since $I_{delay}$ 189 removes charge at the same rate that $I_{delaymx}$ 181 adds charge, the charge on the storage capacitor 183 remains constant.

Because the charge on the storage capacitor 183 did not change, the same process will begin with the following rising edge of the clock source 164 and all subsequent clock edges will have an equivalent 5 ns delay.

In these examples, the magnitudes of the current sources and the storage capacitor 183 are very large but needed to simplify the operational explanation of the computational circuit 145b. Smaller, more realistic values would result in a similar behavior, and depending on the scaling of the parameters; charge, capacitance, voltage and time, would require more clock cycles to increment the delay on the adjustable delay element 165 to an appropriate value.

Figure 20:
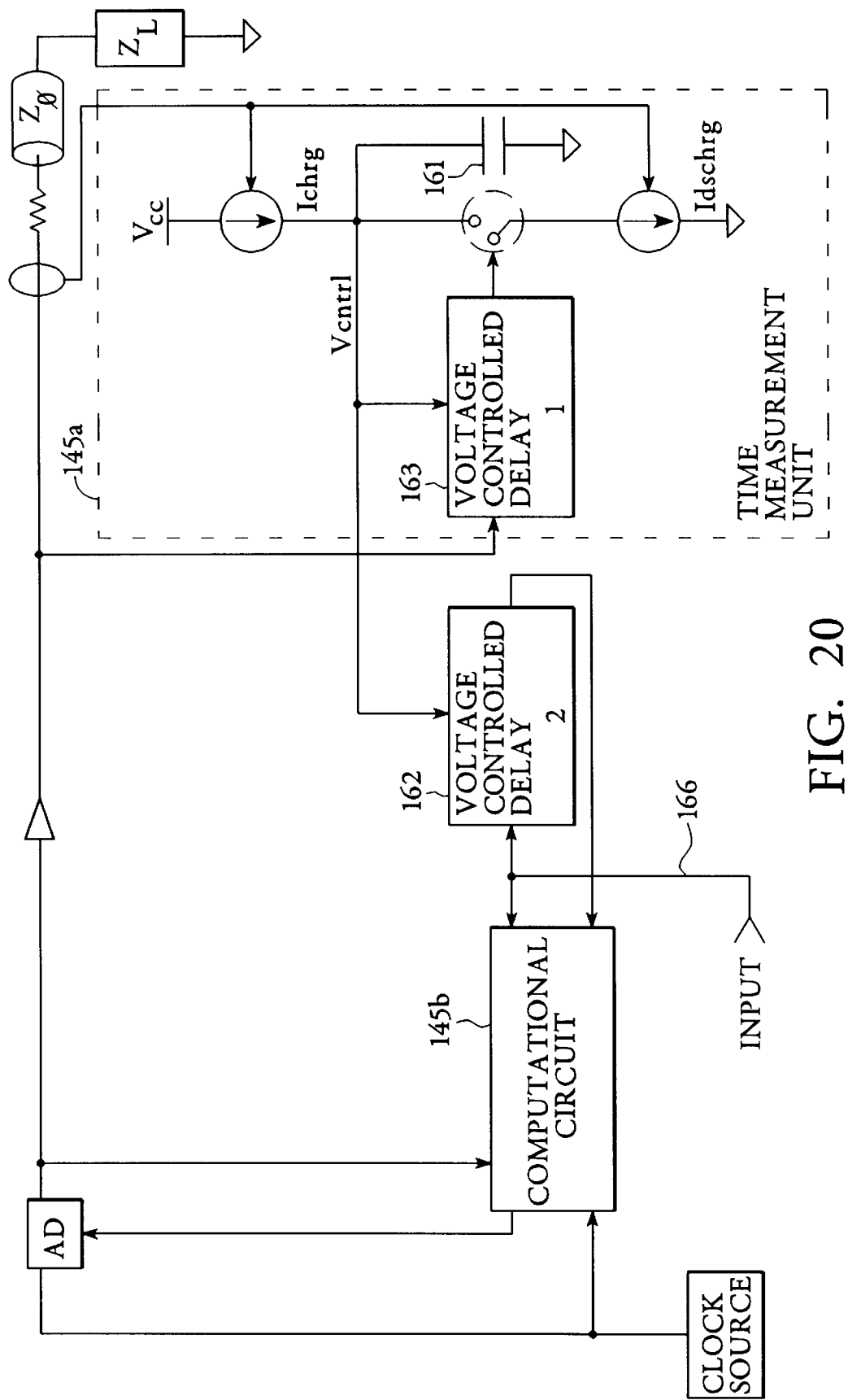
FIG. 20 is a plan view of an alternate clock distribution circuit in accord with the present invention.

FIG. 20 shows an alternate embodiment similar to the embodiment of FIG. 17. In FIG. 20, a second voltage controlled delay 162 is inserted between the time measurement unit 145a and the computational circuit 145b. $V_{cntrl}$, the voltage across storage capacitor 161 within time measurement unit 145a which is a measure of $T_{round\_trip}$ is applied to both the internal voltage control delay 163 and to the second, external voltage controlled delay circuit 162. In this manner, the second voltage controlled delay 162 can delay a separate input 166 by an amount equal to $T_{round\_trip}$. The separate input 166 need not have the same frequency or phase as the input to the first voltage controlled delay 163. For example, the separate input 166 may be connected to the clock source 164 so that all three modules within the computational circuit, explained above, may be triggered off of the clock source 164. Further, the separate input 166 need not be related to the transmission line from which $T_{round\_trip}$ is measured, such as if the separate input 166 comes from an unidentified and independent circuit which requires a measure of $T_{round\_trip}$ to accomplish an undefined task.

All of the previously described embodiments in accord with the present invention progressively adjust the delay of their adjustable delay elements until a point is reached at which clock skew at destination subsystems is eliminated. A discrete amount of time is required for the clock distribution apparatus to learn the amount of delay required for each adjustable delay element. The clock distribution apparatus would need to undergo this learning process every time power is removed from, and then re-applied to, the clock distribution apparatus. To reduce the time required for this learning process, a non-volatile memory may be associated with each phase shift block such that the clock distribution apparatus may record the necessary delay of each phase shift block in the non-volatile memory before power is removed. When power is re-applied, the clock distribution apparatus would already know the required delays for each adjustable delay element. In the preferred embodiment, the non-volatile memory is implemented as an EEPROM or flash memory and uses the memory's floating gate as a continuous charge storage device.

Figure 21:
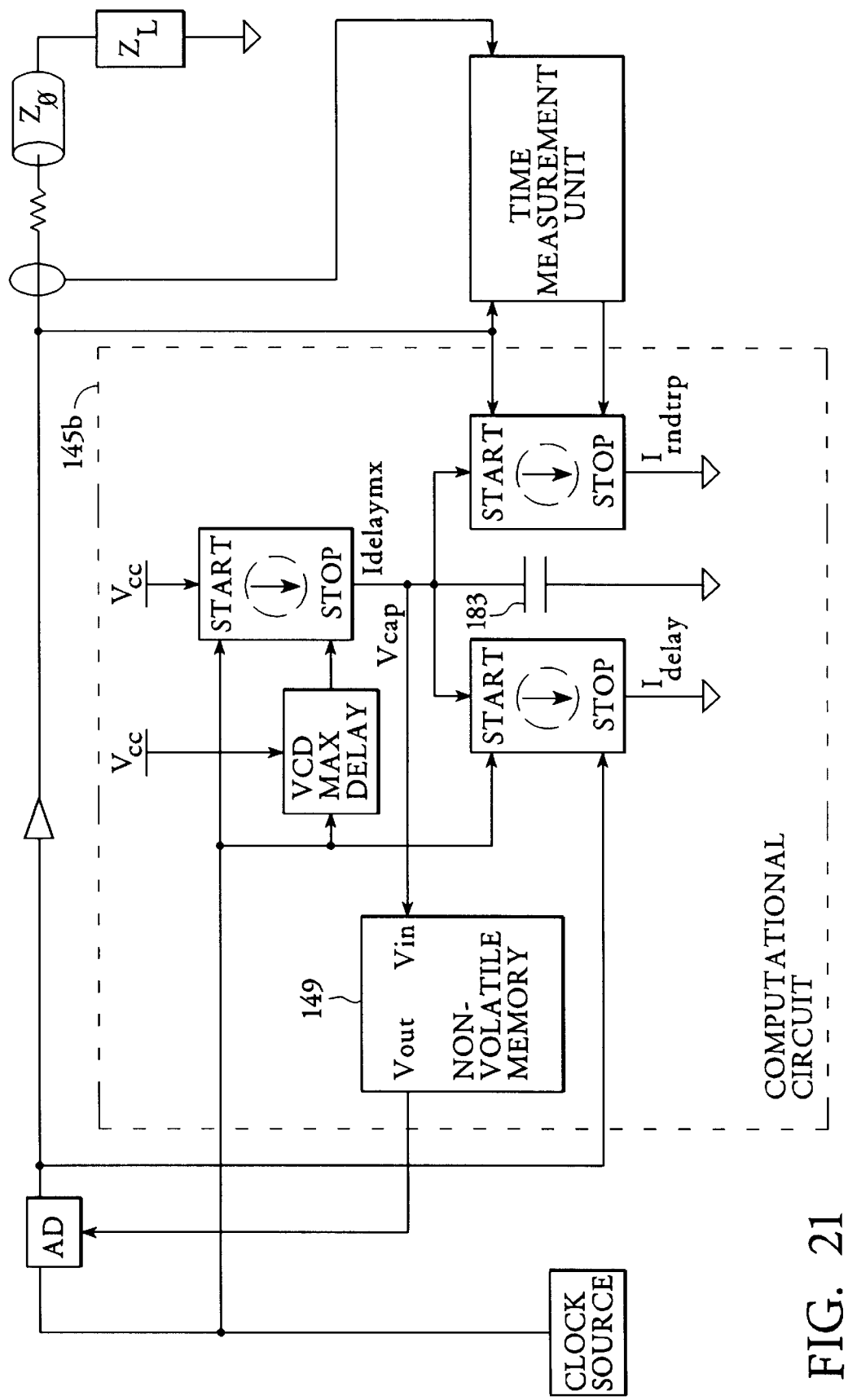
FIG. 21 shows the use of a non-volatile memory in a computational circuit in accord with the present invention.
Figure 22:
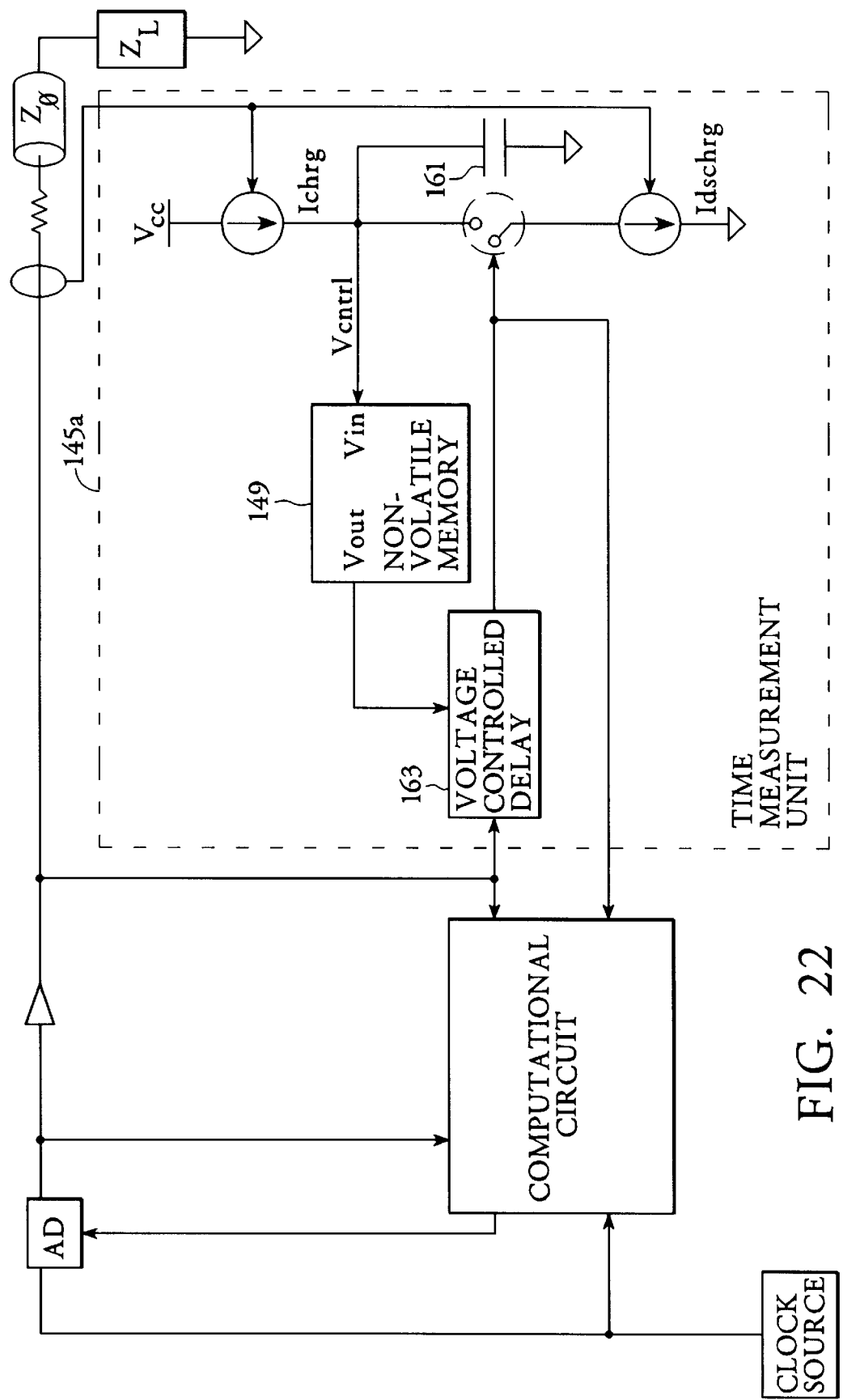
FIG. 22 shows the use of a non-volatile memory in a time measurement unit in accord with the present invention.

As seen in FIG. 21, the non-volatile memory unit 149 can be implemented as part of the computational circuit 145b and store $V_{cap}$, the voltage across the second storage capacitor 183. However, in the preferred embodiment, shown in FIG. 22, the non-volatile memory unit 149 constitutes an integral part of the time measurement unit 145a and stores $V_{cntrl}$, the voltage across storage capacitor 161. The non-volatile memory unit receives $V_{cntrl}$ through its input, $V_{in}$, and sends a voltage of equal magnitude as $V_{cntrl}$ to the voltage controlled delay 163 along its output, $V_{out}$.

Figure 23:
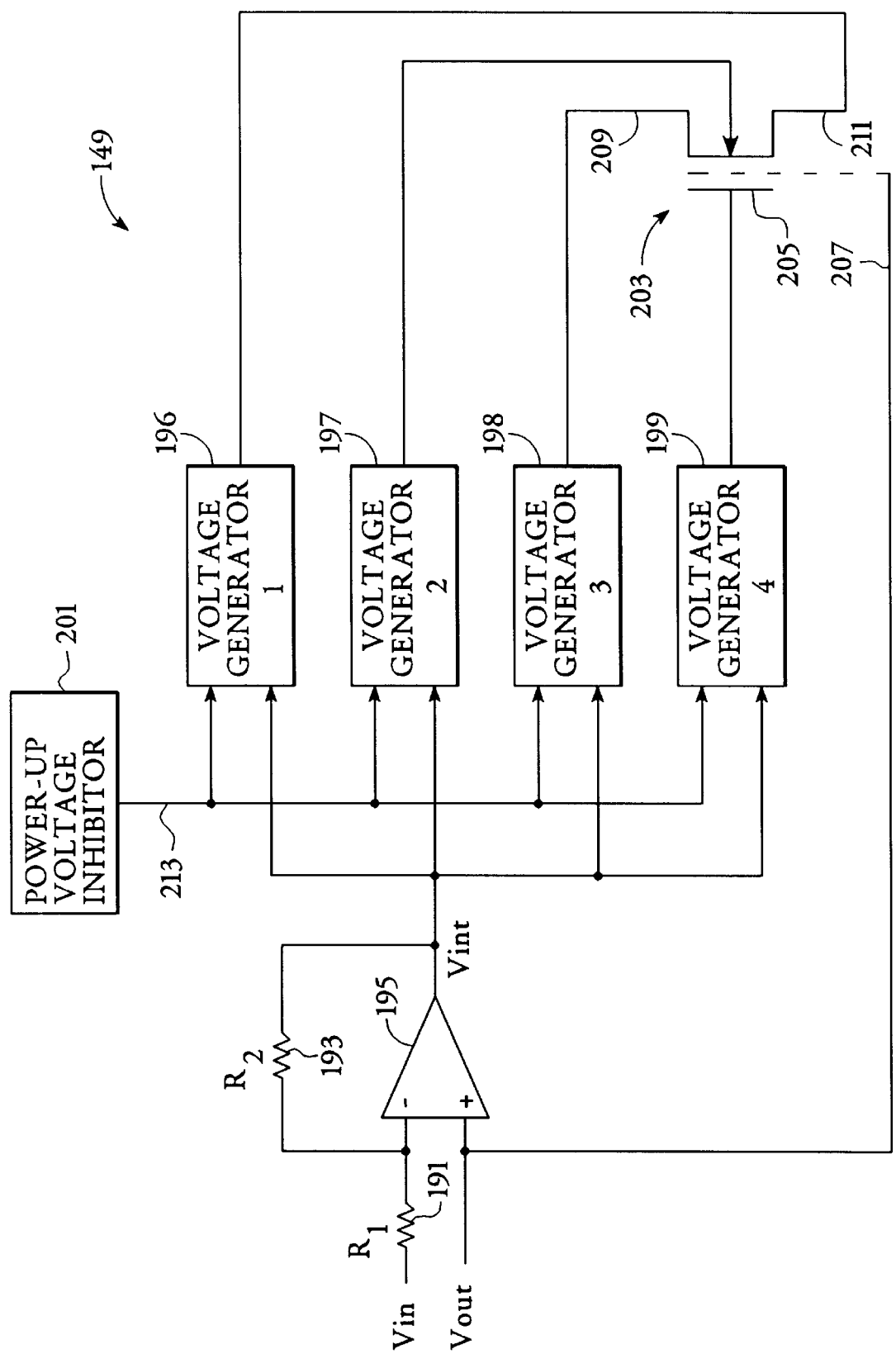
FIG. 23 is a plan view of a non-volatile unit in accord with the present invention.

FIG. 23 shows an internal view of the non-volatile memory unit 149. $V_{in}$ is coupled to the voltage across capacitor 161 of FIG. 22 and goes through a first resistance 191 to a first input of a differential amplifier 195 and to a second resistance R2, 193, as shown in FIG. 23. The second resistance R2, 193, is coupled to the output of the differential amplifier 195, and together with the first resistance R1, 191, the three elements form a voltage follower with a gain of R2/R1. The output of the differential amplifier 195 is an input to four voltage generators, 196–199. All four voltage generators share a common enable signal 213 coming from a power_up voltage inhibitor 201 which disables the voltage generators 196–199 during a power up sequence. The output from the voltage generators 1, 3, and 4 are coupled to the source 211, drain 209, and control gate 205 electrodes of an EEPROM cell 203, respectively. Voltage generator 2 controls the reference ground potential of the body of the EEPROM cell 203. Together, the four voltage generators respond to an input voltage from the differential amplifier 195 and produce voltage outputs which are applied to the EEPROM 203 causing it to be programmed or erased depending on the value of the applied voltages. The floating gate 207 of the EEPROM 203 is the output voltage, $V_{out}$, and is also coupled to a second input of the differential amplifier 195. Thus, the differential amplifier continually compares the input voltage from storage capacitor 161 with the voltage on the floating gate 207. In this manner, it controls the four voltage generators 196–199 to program or erase the EEPROM cell 203 until the voltage on the floating gate is equal to the voltage on capacitor 161. At the point that power is re-applied to the clock distribution apparatus, the voltage on the floating gate will already be at the level needed to eliminate clock skew. During this power up sequence, the power_up voltage inhibitor 201 prevents the four voltage generators 196–199 from changing the voltage on the EEPROM's floating gate 207.

We claim:

1. A clock distribution circuit for achieving substantially simultaneous arrival of timing events at a plurality of digital subsystems comprising:

a clocking means for generating said timing events, said clocking means having a plurality of outputs, each of said outputs being effective for supplying a copy of said timing events;

a plurality of transmission lines;

a plurality of current sensing means;

a plurality of delay means;

each of said plurality of digital subsystems being coupled to said clock distribution circuit at only a corresponding one of said plurality of outputs, each of said plurality of digital subsystems being coupled to said corresponding one of said outputs via a single one of said transmission lines whereby each of said digital subsystems receives one of said conies of said timing events;

each of said plurality of current sensing means being coupled to a corresponding one of said plurality of transmission lines, each of said current sensing means being effective for determining a current flow time during which current flows in said corresponding one of said transmission lines;

each of said plurality of transmission lines being coupled to a corresponding one of said plurality of delay means, each of said plurality of delay means being effective for delaying said timing events by an amount dependent on a predetermined maximum delay reduced by one-half said current flow time whereby the propagation delay of said timing events from each of said outputs to its corresponding one of said digital subsystems is equalized to said predetermined maximum delay.

2. The circuit of claim 1 further defined by phase adjusting means coupled to said clocking means for time shifting said timing events by a desired amount.

3. The circuit of claim 2 wherein said phase adjusting means is a phase-locked loop.

4. The circuit of claim 1 further defined by a frequency dividing means coupled between said clocking means and one of said plurality of delay means whereby the frequency of said timing events is altered.

5. The circuit of claim 1 wherein at least one of said plurality of delay means is coupled to a non-volatile memory storing a signal representing said predetermined maximum delay reduced by one-half its corresponding said current flow time.

6. A clock distribution circuit for achieving simultaneous arrival of clock timing events at digital subsystems comprising:

a source of said clock timing events having a plurality of output points, each of said plurality of output points being connected to a distribution network, said distribution network consisting of a plurality of transmission lines having different lengths;

each of said digital subsystems receiving said clock timing events via a variable delay element connected by means of one of said transmission lines, said transmission lines being terminated at said digital subsystems with an impedance at least partially reflective of said clock timing events, each of said digital subsystems being coupled to said clock distribution circuit at only one of said output points via one of said transmission lines;

a plurality of current sensing means for sensing a flow of current in each of said transmission lines;

a plurality of time measuring means for determining a current flow time during which current flows in each of said transmission lines as determined by said plurality of current sensing means, said current flow time being the propagation time of said clock timing events through each of said transmission lines from said clock distribution circuit to said digital subsystems and back; and an arithmetic unit means coupled to each time measuring means for determining one-half said current flow time and subtracting said one-half current flow time from a predetermined maximum time, the resultant value being a variable delay signal coupled to a corresponding one of said variable delay elements, each of said variable delay elements being coupled to one of said plurality of transmission lines and effective for delaying said clock timing events by an amount determined by said variable delay signal.

7. The circuit of claim 6 further defined by phase adjusting means connected at said source of clock timing events for time shifting said clock timing events by a desired amount.

8. The circuit of claim 7 wherein said phase adjusting means is a phase-locked loop.

9. The circuit of claim 6 further defined by a frequency dividing means coupled between said source of clock timing events and said variable delay elements for the purpose of altering the frequency of said clock timing events.

10. The circuit of claim 6 wherein one of said variable delay elements receives said timing events at a frequency different from another of said variable delay elements.

11. The circuit of claim 6 further comprising a second plurality of variable delay elements responsive to said plurality of time measuring means and coupled to control inputs of said arithmetic unit, said plurality of second variable delay elements being further coupled to receive an additional input signal and effective for delaying said additional input signal to said arithmetic unit by an amount proportional to said current flow time.

12. The circuit of claim 6 wherein said plurality of variable delay elements are servo controlled.

13. The circuit of claim 6 wherein each of said transmission lines has a matched impedance input.

14. The circuit of claim 6 wherein said variable delay signal of said arithmetic unit is an analog voltage coupled to a non-volatile memory cell for storing said analog voltage.

15. The circuit of claim 6 wherein said arithmetic unit means is coupled to a non-volatile memory for storing said variable delay signal.

16. The circuit of claim 6 wherein each of said time measuring means for determining a current flow time during which current flows in a respective one of said plurality of transmission lines accepts the termination of current flow as being the point when a predetermined percentage of charge needed to change the logic state of said respective one of said plurality of said transmission lines has been accumulated on said respective transmission line.

17. A clock distribution circuit for supplying clock timing events to a digital subsystem and for achieving a clock delay time of said clock timing events substantially similar to a predetermined maximum delay, said clock distribution circuit comprising:

a source of said clock timing events connected to a variable delay element, said variable delay element being coupled to an output lead;

a transmission line for coupling said output lead to said digital subsystem;

said digital subsystem receiving said clock timing events through said variable delay elements, output lead and said transmission line, said transmission line being terminated at said digital subsystem with an impedance at least partially reflective of said clock timing events and effective for producing a reflection signal along said transmission from said digital subsystem to said output lead;

a current monitoring means coupled to monitor current through said output lead;

a time measuring means coupled to said current monitoring means and effective for determining a measure of time substantially similar to one-half the time during which current flows through said output lead, this measure of time being similar to a forward propagation time during which a clock timing event propagates from said output lead to said digital subsystem; and a servo means responsive to said time measuring means and coupled to monitor a variable delay through said variable delay element, said servo means being effective for servo control of said variable delay element and for adjusting said variable delay element such that the sum of said variable delay through said variable delay element plus said forward propagation time substantially equals said maximum delay time.

18. The circuit of claim 17 wherein said servo means includes a capacitor having a charging circuit means for receiving charge proportional to a time equal to said maximum delay time and further having a first and a second discharging circuit means, said first discharging circuit means being effective for discharging said capacitor for a first discharging time comparable to said measured forward propagation time, said second discharging circuit means being effective for discharging said capacitor for a second discharging time estimated to be the difference between said maximum delay time and said measured forward propagation time, the voltage across said capacitor being a control input to said variable delay element.

19. The circuit of claim 18 wherein said first discharging circuit means further includes a current source receiving input signals from said time measuring means and from said variable delay element.

20. The circuit of claim 18 wherein said second discharging circuit means further includes a current source receiving input signals from said source of clock timing events and from one of said variable delay element.

21. The circuit of claim 17 wherein said time measuring means is coupled to a non-volatile memory for storing said forward propagation time.

22. The circuit of claim 18 wherein said servo means is coupled to a non-volatile memory for storing said voltage across said capacitor.

23. The circuit of claim 18 wherein said charging circuit means further including a current source receiving input control signals from a means for measuring said maximum delay time.

* * * * *